United States Patent [19]

Ema

[11] Patent Number: 4,953,126

[45] Date of Patent: Aug. 28, 1990

[54] DYNAMIC RANDOM ACCESS MEMORY DEVICE INCLUDING A STACK CAPACITOR

[75] Inventor: Taiji Ema, Kawasaki, Japan

[73] Assignee: Fujitsu Limited, Kawasaki, Japan

[21] Appl. No.: 462,290

[22] Filed: Dec. 29, 1989

Related U.S. Application Data

[63] Continuation of Ser. No. 274,279, Nov. 22, 1988, abandoned.

[30] Foreign Application Priority Data

Nov. 25, 1987 [JP] Japan .................................. 62-296669
Nov. 30, 1989 [JP] Japan .................................. 62-302464

[51] Int. Cl.$^5$ ........................ G11C 11/34; G11C 11/24
[52] U.S. Cl. .................................... 365/182; 365/149; 357/23.6; 357/41
[58] Field of Search ............... 365/182, 149, 154, 156; 357/23.6, 23.9, 595, 42, 59 G, 59 K; 437/52, 60, 41; 148/DIG. 148, DIG. 52

[56] References Cited

U.S. PATENT DOCUMENTS 4,742,018  5/1988  Kimura et al. ...................... 365/149
4,794,563  12/1988  Maeda ............................ 365/182 X

FOREIGN PATENT DOCUMENTS 0191612  8/1986  European Pat. Off. ........... 357/23.6

*Primary Examiner*—Stuart N. Hecker
*Assistant Examiner*—Alfonso Garcia
*Attorney, Agent, or Firm*—Staas & Halsey

[57] ABSTRACT

A Dynamic Random Access Memory device includes bit lines formed on an interlayer insulation film which covers gate electrodes on an insulation film on a semiconductor substrate. Each bit line is in contact with the corresponding source region formed in the substrate through an opening in the insulation films. Another insulation film is formed so as to cover the bit lines. A storage electrode is formed on the insulation film covering the bit line, and is in contact with a drain region in the substrate through another opening in the insulation films. The bit line has a vertical layer level lower than that of the storage electrode. The storage electrode is covered with a dielectric film, which is covered with an opposed electrode.

18 Claims, 29 Drawing Sheets

FIG. IA
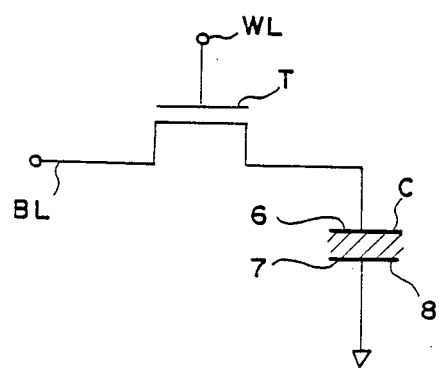
FIG. IB
PRIOR ART
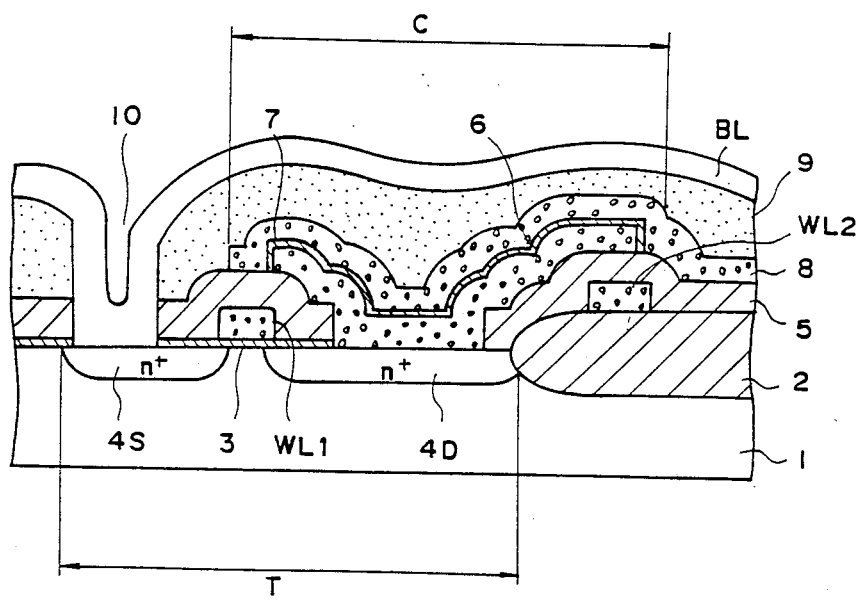

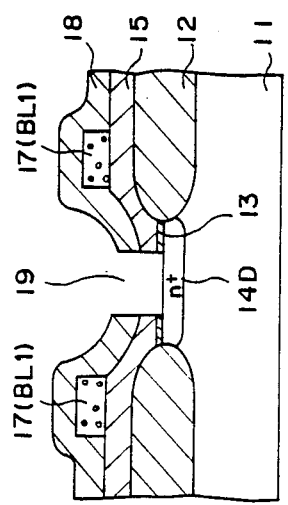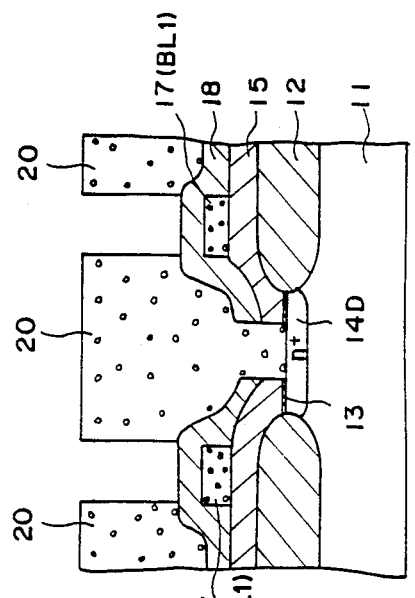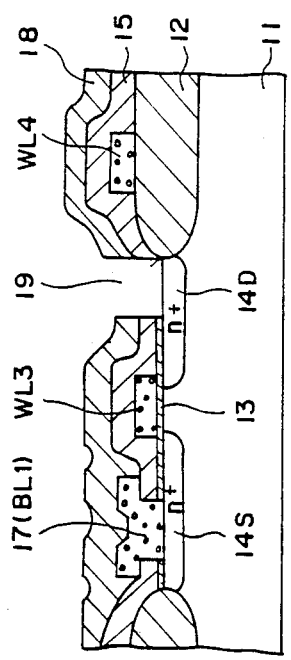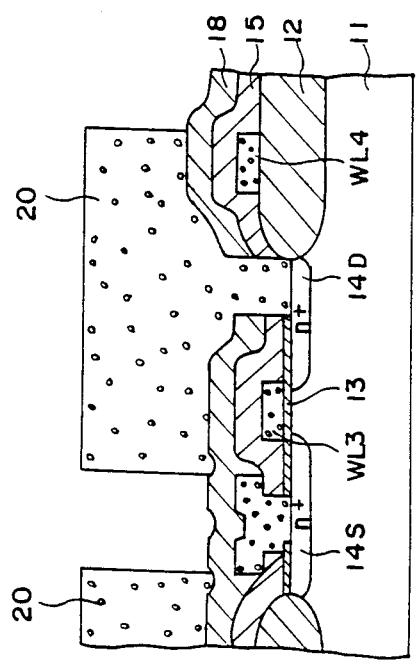

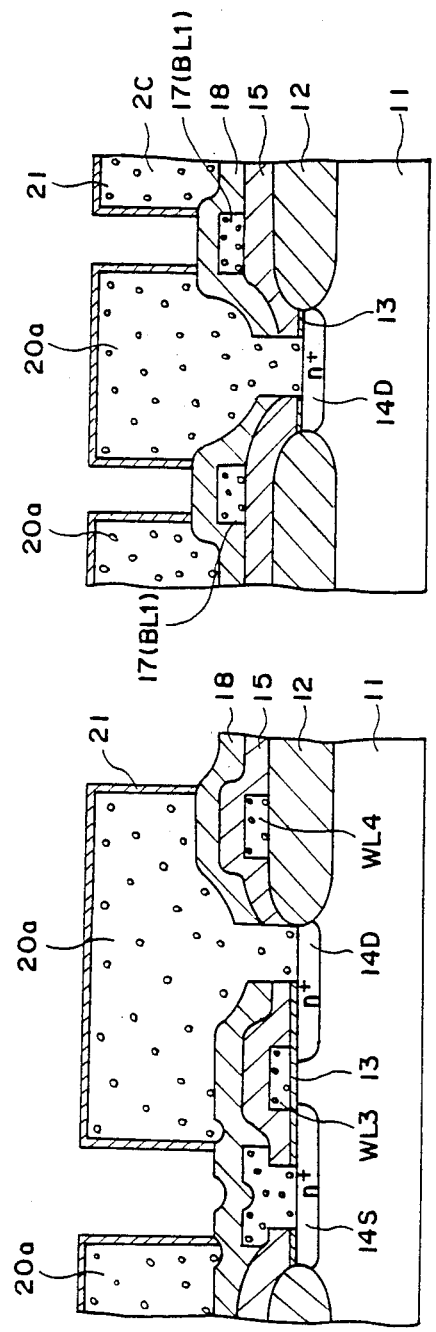

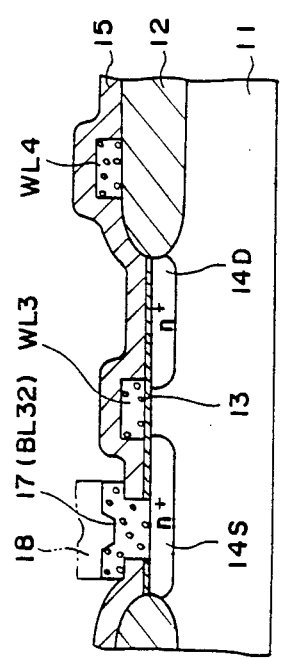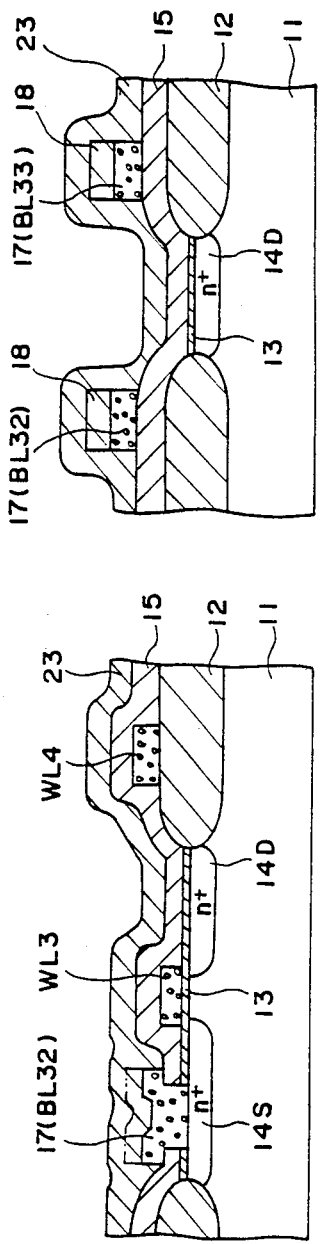

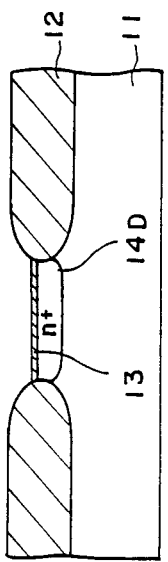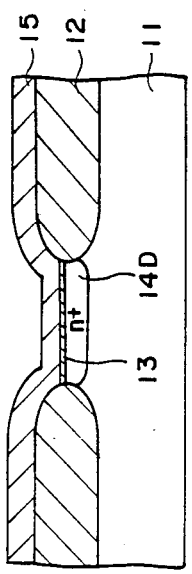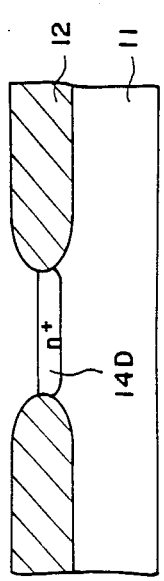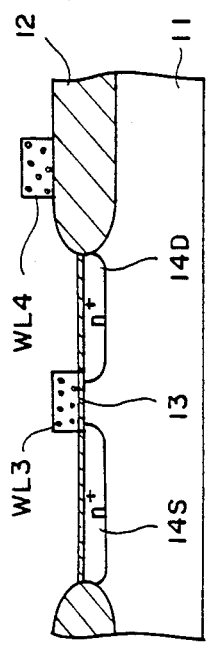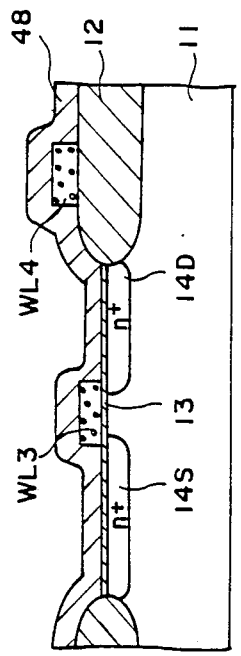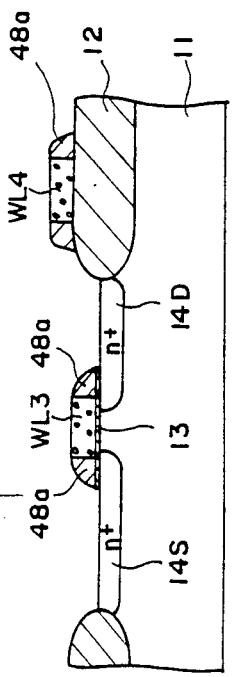

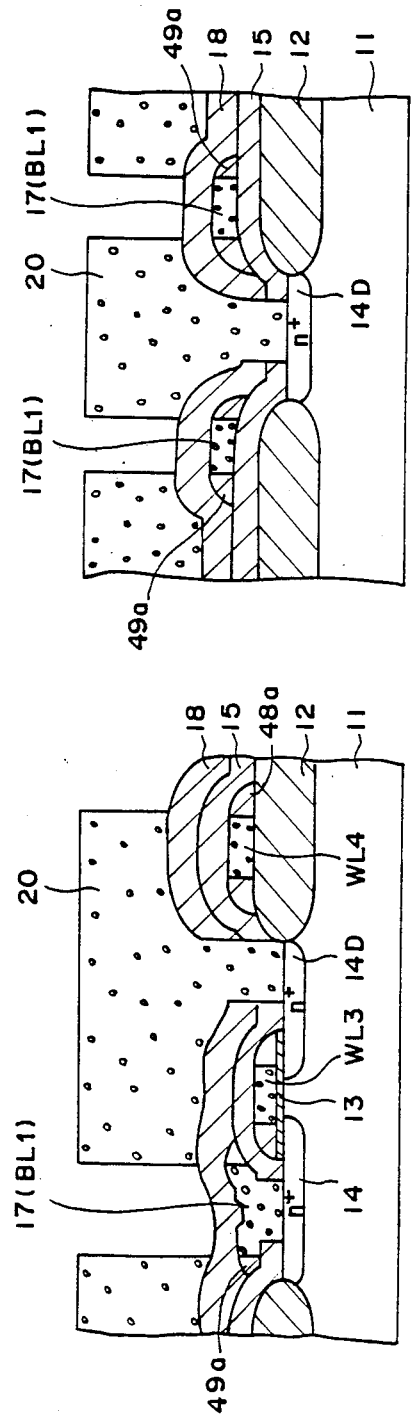

DYNAMIC RANDOM ACCESS MEMORY DEVICE INCLUDING A STACK CAPACITOR

This is a continuation of copending application Ser. No. 07/274,279 filed on 11/22/88, now abandoned.

BACKGROUND OF THE INVENTION

The present invention generally relates to a dynamic random access memory device and a method for producing the same, and more particularly, to improvements in the layer structure of a dynamic random access memory device and a method for producing such an improved dynamic random access memory device.

A dynamic random access memory (hereinafter simply referred to as a DRAM device) has a number of memory cells. Each memory cell is composed of a memory cell capacitor and a transfer gate transistor. Currently, there has been considerable activity in reduction of the size of a DRAM device. It is required particularly to reduce the size of a memory cell capacitor in order to reduce the size of DRAM devices. It is noted that the area of memory cell capacitors which occupies a semiconductor substrate decreases, capacitance of each memory cell capacitor decreases. The capacitance of the memory cell capacitor depends greatly on the size of a storage electrode of the memory cell, which is paired with an opposed electrode thereof. As the area of the storage capacitor which occupies the semiconductor substrate decreases, the capacitance of the memory cell capacitor decreases considerably. The reduction of the size of the memory cell capacitor, particularly the reduction of the size of the storage electrode causes the following problems in addition to the decrease in capacitance of the memory cell capacitor. First, soft errors due to irradiation of α-particles increase with a decrease of the capacitance of the memory cell capacitor Secondly, although it is known to make the storage electrode thick so as to increase the side wall area thereof and thereby increase the entire surface area of the storage electrode, it is difficult to obtain a fine pattern because the aspect ratio with respect to bit lines and contact holes increases. Thirdly, neighboring bit lines are located closer, or in other words, a separation distance between the neighboring bit lines decreases. The closer the neighboring bit lines are arranged, the greater the coupling capacitance therebetween.

SUMMARY OF THE INVENTION

It is therefore a general object of the present invention to provide a novel and useful random access memory device and a method for producing the same in which the aforementioned disadvantages are eliminated.

A more specific object of the present invention is to provide a random access memory device having a storage electrode having an increased surface area. An increased surface area of the storage electrode can provide various advantages.

Another object of the present invention is to provide a random access memory device in which neighboring bit lines are electrically shielded very well.

The above objects of the present invention can be achieved by a random access memory device which comprises a semiconductor substrate having a source region and a drain region, a first insulation film formed on a surface of the semiconductor substrate, a gate electrode formed on the first insulation film, a second insulation film formed so as to the gate electrode, a bit line formed on the second insulation film, the bit line being in contact with the source region through a first opening formed in the first and second insulation films, a third insulation film formed so as to cover the bit line, a storage electrode formed on the third insulation film and being in contact with the drain region through a second opening formed in the first, second and third insulation films, a dielectric film formed so as to surround the storage electrode, and an opposed electrode formed so as to cover the dielectric film.

Still another object of the present invention is to provide a method for producing the above-mentioned DRAM device.

The above another object of the present invention can be achieved by a method which comprises the steps of forming a gate electrode on a first insulation film formed on a semiconductor substrate and source and drain regions in the semiconductor substrate, forming a second insulation film so as to cover the gate electrode, forming a first opening in the first and second insulation films, forming a bit line being in contact with the drain region through the first opening and overlying the second insulation film, forming a third insulation film so as to cover the bit line, forming a second opening in the first, second and third insulation films, forming a storage electrode being in contact with the source region through the second opening and overlying the third insulation film, forming a dielectric film so as to surround the storage electrode; and forming an opposed electrode so as to cover the dielectric film.

A further object of the present invention is to provide a method for producing the aforementioned DRAM device in which a contact hole with respect to the drain region and the storage electrode is formed by a self-alignment process.

The further object of the present invention can be achieved by a method for producing the DRAM which comprises the steps of forming a gate electrode on a first insulation film formed on a semiconductor substrate and source and drain regions in the semiconductor substrate, forming a second insulation film so as to cover the gate electrode, forming a first opening in the first and second embodiment, forming a conductive film on the second insulation film, forming a third insulation film on the conductive film, patterning the conductive film and the third insulation film so as to shape a bit line on which the third insulation film remains, forming a fourth insulation film on the bit line and the second and third insulation films, forming a second opening in the first, second and fourth insulation films by a self-alignment process in which the bit line is used as a mask film so that the fourth insulation film remains so as to surround a side wall of the bit line, forming a storage electrode being in contact with the drain region and overlying the third and fourth insulation films, forming a dielectric film so as to surround the storage electrode, and forming an opposed electrode so as to cover the dielectric film.

Other objects, features and advantages of the present invention will become apparent from the following detailed description when read in conjunction with the accompanying drawings.

BRIEF DESCRIPTION OF THE DRAWINGS

FIG. 1A is a circuit diagram of a memory cell of a DRAM device;

FIG. 1B is a cross sectional view of a layer structure of a memory cell for a conventional DRAM device;

FIGS. 6A through 6F are cross sectional views taken along a line $II_A$—$II_A$ shown in FIG. 2C, which are observed in different manufacturing steps for the first embodiment;

FIGS. 7A through 7F are cross sectional views taken along a line $II_B$—$II_B$ shown in FIG. 2C, which are observed in different manufacturing steps for the first embodiment;

FIGS. 8A through 8H are cross sectional views taken along a line $III_A$—$III_A$ shown in FIG. 4C, which are observed in different manufacturing steps for the third embodiment;

FIGS. 9A through 9H are cross sectional views taken along a line $III_B$—$III_B$ shown in FIG. 4C, which are observed in different manufacturing steps for the third embodiment;

FIGS. 14A through 14K are cross sectional views taken along a line $XIII_A$—$XIII_A$ shown in FIG. 13C, which are observed at different manufacturing steps for the modification of FIGS. 13A through 13C; and FIGS. 15A through 15K are cross sectional views taken along a line $XIII_B$—$XIII_B$ shown in FIG. 13C, which are observed at different manufacturing steps for the modification of FIGS. 13A through 13C.

DETAILED DESCRIPTION

Figure 2A:
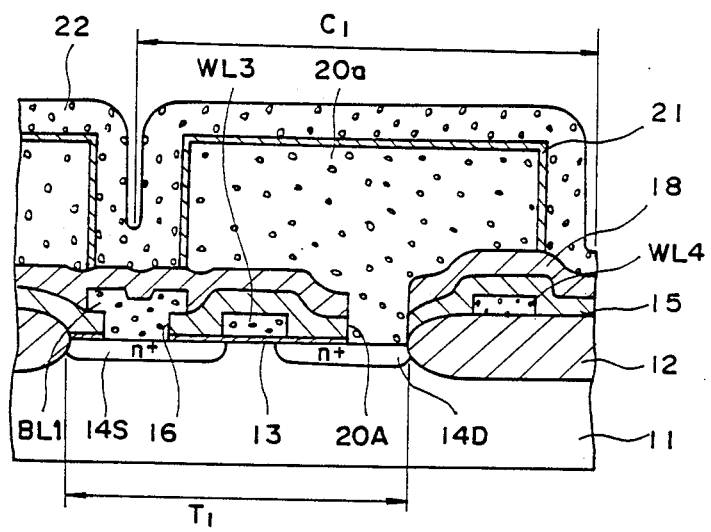
FIGS. 2A through 2C are views showing the first preferred embodiment of the present invention.

Before describing the preferred embodiments of the present invention, a description is given of a memory cell for a conventional DRAM device with reference to FIGS. 1A and 1B.

FIG. 1A is a circuit diagram of a memory cell for a DRAM device. As shown, a memory cell is composed of a transfer gate transistor T and a memory cell capacitor C. A source of the transfer gate transistor T is connected to a corresponding bit line BL, and a drain thereof is connected to a storage electrode 6. A gate of the transfer gate transistor T is connected to a corresponding word line WL. An opposed electrode 8 is connected to a constant power source. A dielectric film 7 is provided between the storage electrode 6 and the opposed electrode 8.

FIG. 1B shows a cross section of a conventional layer structure which provides the memory cell of FIG. 1A. The memory cell comprises a p-type silicon substrate 1, a field insulation film 2, a gate insulation film 3, a drain region 4D, a source region 4S, and a silicon dioxide film 5. The gate electrode WL1 is concerned with the transfer gate transistor T, and the gate electrode WL2 is concerned with another transfer gate transistor (not shown). Gate electrodes WL1 and WL2 of polysilicon are formed on the gate insulation film 3 and the silicon dioxide film 5, respectively. The storage electrode 6 is formed so as to be in contact with the drain region 4D. The dielectric film 7 is formed so as to surround the storage electrode 6. The dielectric film 7 is covered with the opposed electrode 8. A passivation film 9 of phosphosilicate glass (PSG) is formed on the entire surface of the silicon substrate 1. The bit line BL which overlies the passivation film 9 is in contact with the source region 4S. In the conventional layer structure of FIG. 1B, it is particularly noted that the bit line BL has a vertical layer level higher than that of the layer of the memory cell capacitor C composed of the storage electrode 6, the dielectric film 7 and the opposed electrode 8.

Figure 2B:
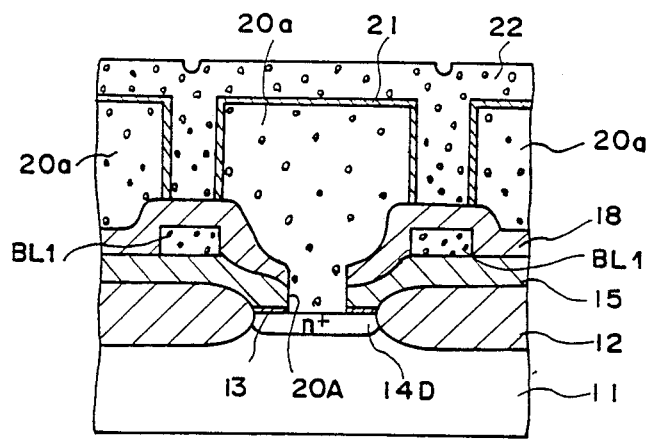
Figure 2C:
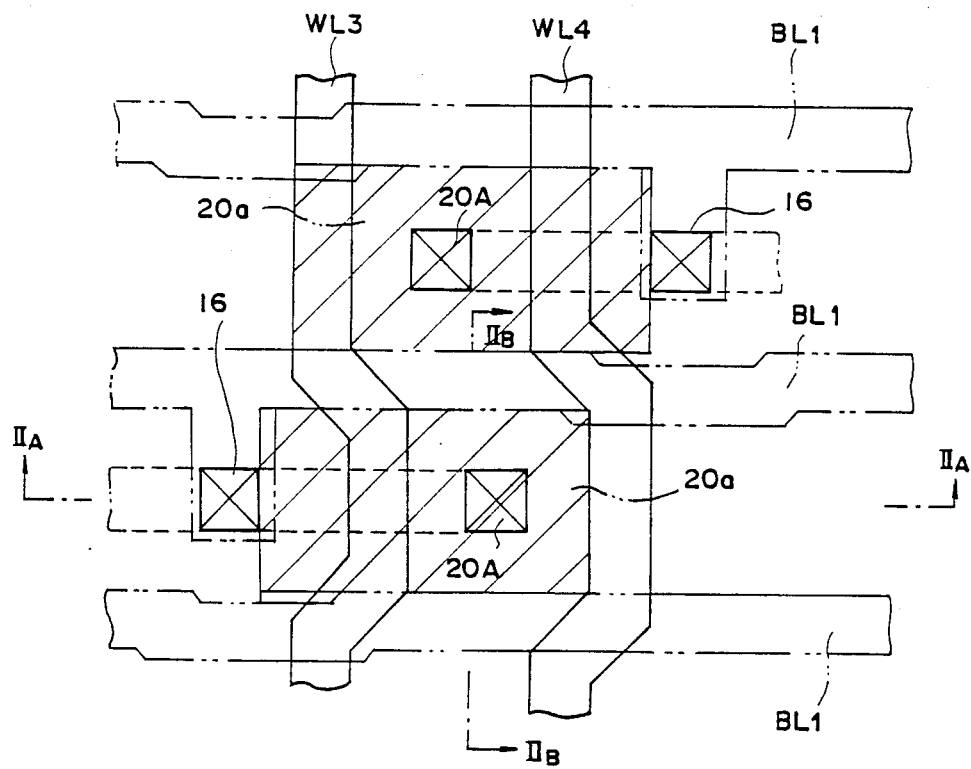

A description is given of the first preferred embodiment of the present invention with reference to FIGS. 2A through 2C.

FIGS. 2A through 2C show the first preferred embodiment of the present invention. FIG. 2C is a plan view of the first embodiment. FIG. 2A is a cross sectional view taken along the line $II_A$—$II_A$ shown in FIG. 2C, and FIG. 2B is a cross sectional view taken along the line $II_B$—$II_B$.

Referring to FIGS. 2A through 2C, a field insulation film 12 is formed on a main surface of a silicon substrate 11. A gate insulation layer 13 is formed on the surface of the silicon substrate 11. Gate electrodes WL3 and WL4 of polysilicon films are formed on the gate insulation films 13 and the field insulation film 12, respectively. The gate electrodes WL3 and WL4 function as word lines of the transfer gate transistor T1. Then, impurity diffusion layers 14S and 14D are formed by implanting arsenic ions (As+) into the silicon substrate 11, wherein the gate electrodes WL3 and WL4 are used as mask. The impurity diffusion layers 14S and 14D function as the source and drain of a transfer gate transistor T1, respectively. An interlayer insulation film 15 of silicon dioxide ($SiO_2$) is formed so as to cover the gate electrodes WL3 and WL4. Bit lines BL1 of polycide or polysilicon which contains $n_+$-type impurity ions such as arsenic ions (As+) are formed so as to make contact with the source region 14S through a bit line contact hole 16, and overlie the interlayer insulation film 15. An insulation film 18 of silicon dioxide film is formed on the interlayer insulation film 15 so as to cover the bit lines BL1. The transfer gate transistor T1 is composed of the drain and source regions 14D and 14S, the gate electrode WL3 and the bit line BL1.

A storage electrode 20a is formed on the silicon dioxide film 18 and is in contact with the drain region 14D through a contact hole 20A. The storage electrode 20a is made of polysilicon, and is doped with n+-type impurity ions such as arsenic (As+). The storage electrode 20a is covered with a dielectric film 21 of silicon dioxide, which is formed by thermal oxidation with respect to the storage electrode 20a. An opposed electrode 22, which is paired with the storage electrode 20a, is formed so as to surround the dielectric film 21. The opposed electrode 22 is made of polysilicon containing n+-type impurity ions such as phosphorus. A memory cell capacitor or storage capacitor C1 is composed of the storage electrode 20a, the dielectric film 21 and the opposed electrode 22.

It is particularly noted that each bit line BL1 has a layer level lower than that of the storage electrode 20a. Therefore, it is unnecessary to form bit lines on an insulation film which covers the memory cell capacitor. Additionally, it becomes possible to increase the storage electrode 20a because there is no bit line contact hole in the insulation film which covers the memory cell capacitor. As a result, the storage electrode 20a thicker than that of the storage electrode 6 shown in FIG. 1B can be formed. It is noted that the thicker storage electrode 20a increases the capacitance of the memory cell capacitor. In the case where each bit line has a layer level higher than that of the storage electrode as in the case of the conventional DRAM device of FIG. 1B, there is a limit on the film thickness of the storage electrode 6. This is because the presence of a thick storage electrode in the conventional layer structure makes it difficult to make contacts between the source regions 3S and the bit lines BL.

It is further noted that the adjacent bit lines BL1 of the first embodiment are electrically shielded by the storage electrode 20a and opposed electrode 22 interposed therebetween. Although the storage electrode 20a is normally in a floating state, there exists the strong capacitive coupling between the storage electrode 20a and the opposed electrode 22. As a result, the storage electrode 20a can function as an electrical shield member with respect to the neighboring bit lines BL1. With the above structure, it becomes possible to reduce noise introduced on the bit lines BL1.

Figure 3A:
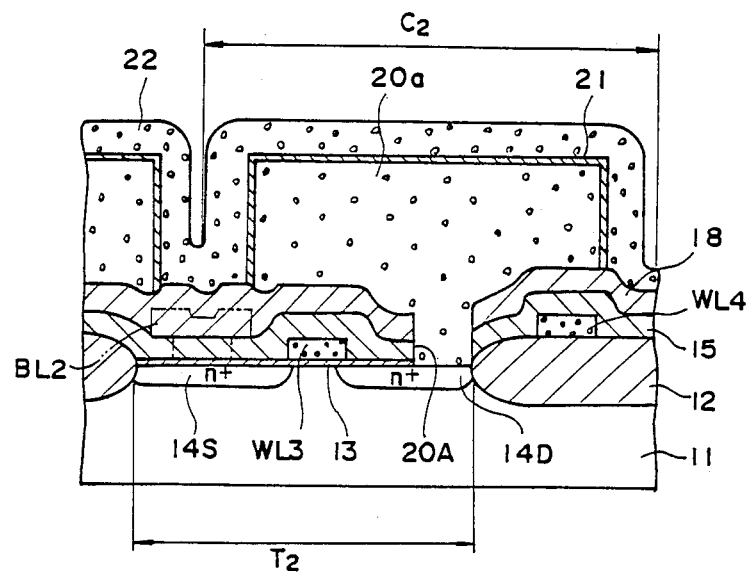
FIGS. 3A through 3C are views showing the second preferred embodiment of the present invention.
Figure 3B:
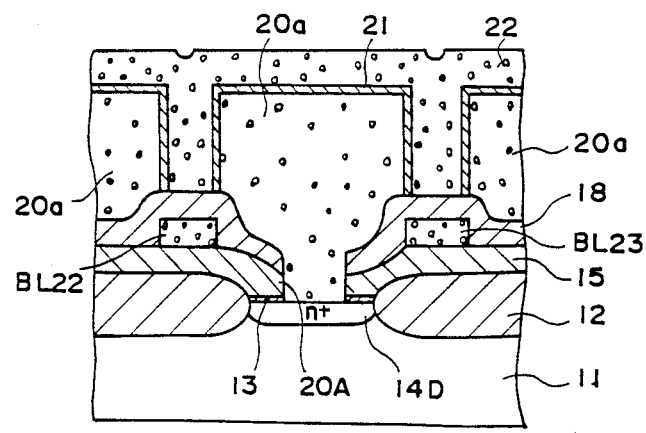
Figure 3C:
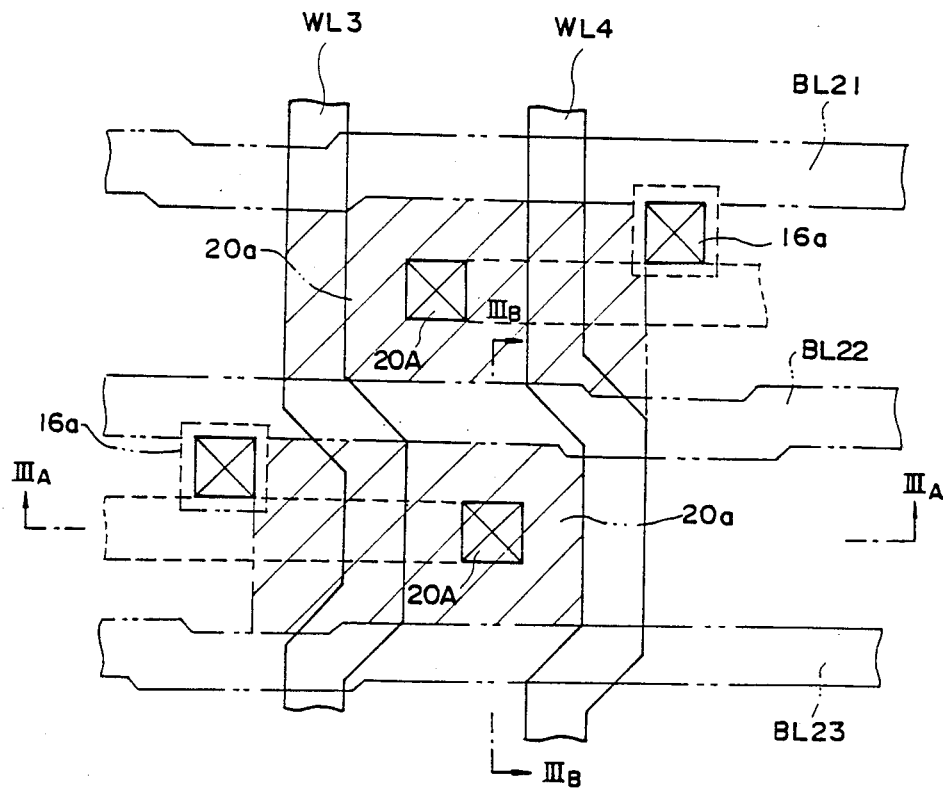

A description is given of the second preferred embodiment of the present invention with reference to FIGS. 3A through 3C. In FIGS. 3A through 3C, those parts which are the same as those in the previous figures, are given the same reference numerals. FIGS. 3A and 3B are cross sectional views taken along the lines $III_A$—$III_A$ and $III_B$—$III_B$ of FIG. 3C, respectively.

The second embodiment of the present invention is composed of a transfer gate transistor T2 and a memory cell capacitor C2, as in the case of the first embodiment. The second embodiment is different from the first embodiment in position of bit line contact holes. As shown in FIG. 2C, each bit line contact hole 16 and the corresponding storage electrode contact hole 20A are aligned in the direction of extension of the bit lines BL1. Particularly, the bit line contact hole 16 is positioned in the center of a distance between the neighboring bit lines BL1. On the other hand, as shown in FIG. 3C, a bit line contact hole 16a with respect to a bit line BL22 and the corresponding storage electrode contact hole 20A of the transfer gate transistor T2, are not arranged into a line. The bit line contact hole 16a of the bit line BL22 is positioned closer to the bit line BL22 than a bit line BL23. Similarly, the bit line contact hole 16a of a bit line BL21 is positioned closer to the bit line BL21 than the bit line BL22. The cross section of the contact hole 16a of the bit line BL22 does not appear in the cross section of FIG. 3A. That is, the cross section of FIG. 3A differs from the cross section of FIG. 2A. With the aforementioned arrangement of the bit line contact holes 16a, it becomes possible to improve insulation properties between the neighboring bit lines such as the bit lines BL21 and BL22 and to achieve easy patterning. The source region 14S is also different in shape from the source region 14S of the first embodiment. Other portions of the second embodiment are the same as those of the first embodiment.

Figure 4A:
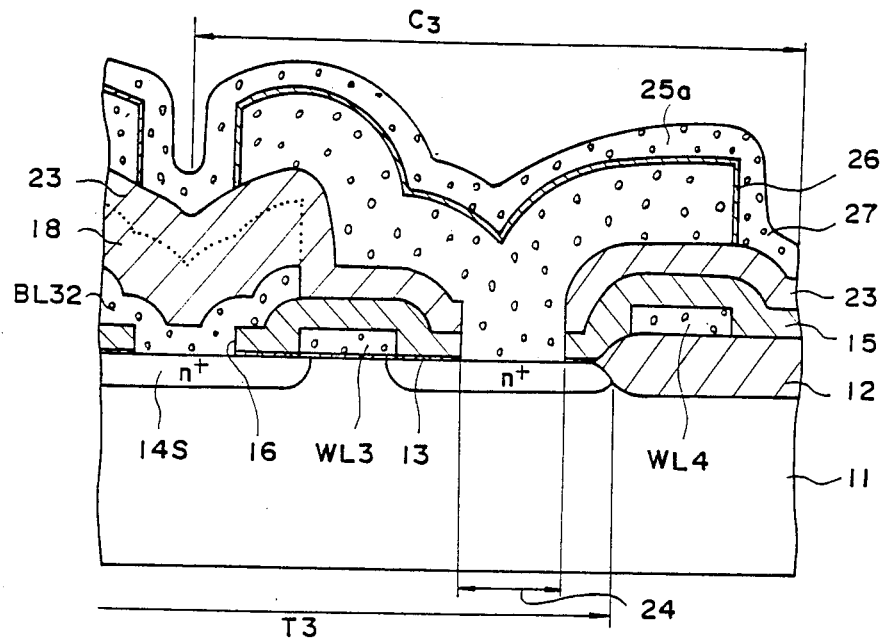
FIGS. 4A through 4C are views showing the third preferred embodiment of the present invention.
Figure 4B:
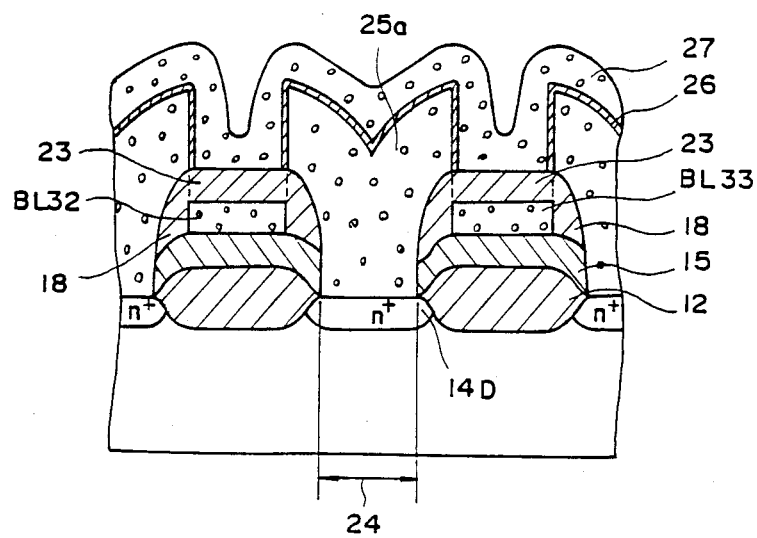
Figure 4C:
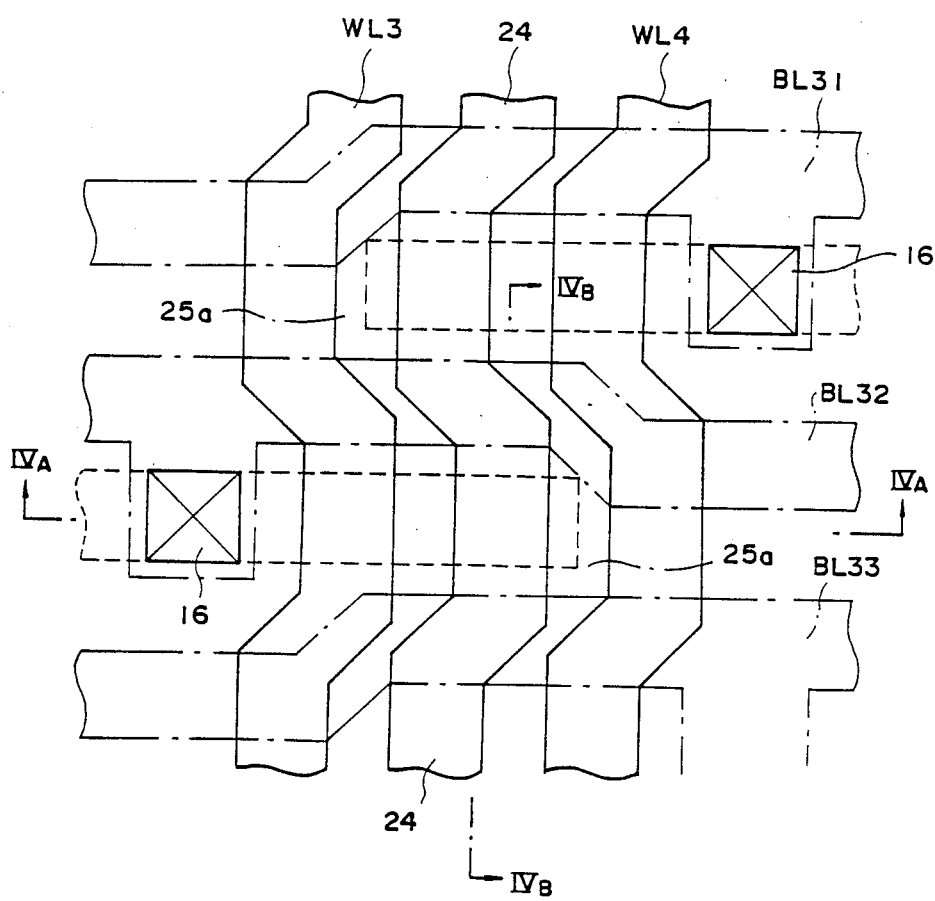

A description is given of the third embodiment of the present invention with reference to FIGS. 4A through 4C. FIGS. 4A and 4B are cross sectional views taken along the lines $IV_A$—$IV_A$ and $IV_B$—$IV_B$ of FIG. 4C, respectively. The third embodiment is composed of a transfer gate transistor T3 and a memory cell capacitor C3. The transfer gate transistor T3 comprises the source and drain regions 14S and 14D, the gate electrode 13 and a bit line BL32. The memory cell capacitor C3 comprises a storage electrode 25a of polysilicon, a dielectric film 26 of silicon dioxide, and an opposed electrode 27 of polysilicon. The storage electrode 25a and the opposed electrode 27 are doped with n+-type impurity such as arsenic (As) and phosphorus (P), respectively.

The third embodiment has an essential feature in which it has a storage electrode contact hole 24 which is formed in an insulation film by a self-alignment process in which bit lines BL31, BL32 and BL33 function as a resist mask film. As shown in FIG. 4C, the storage electrode contact hole 24 has a slit shape. By the self-alignment process, it is unnecessary to carry out a positioning operation with respect to the storage electrode contact holes 24. Additionally, a decreased area of the memory cell which occupies the silicon substrate 11, is obtainable.

Figure 5A:
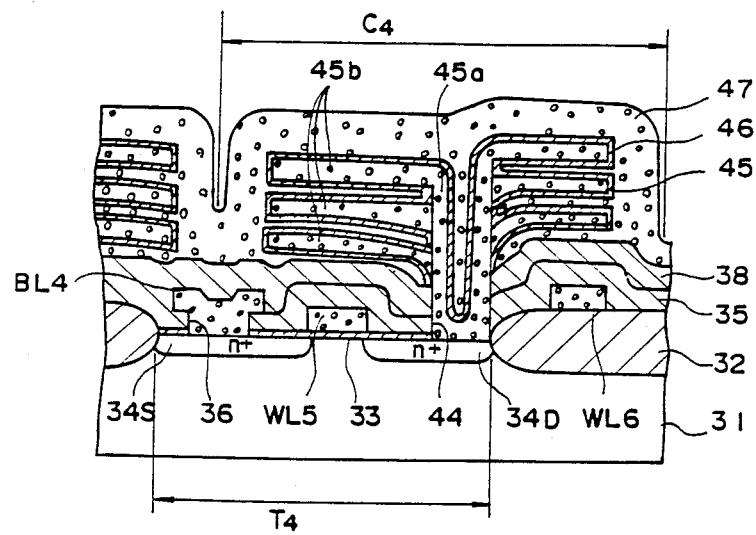
FIGS. 5A through 5C are views showing the fourth preferred embodiment of the present invention.
Figure 5B:
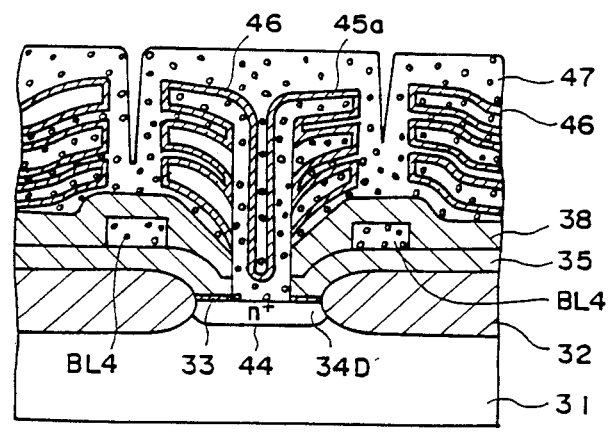
Figure 5C:
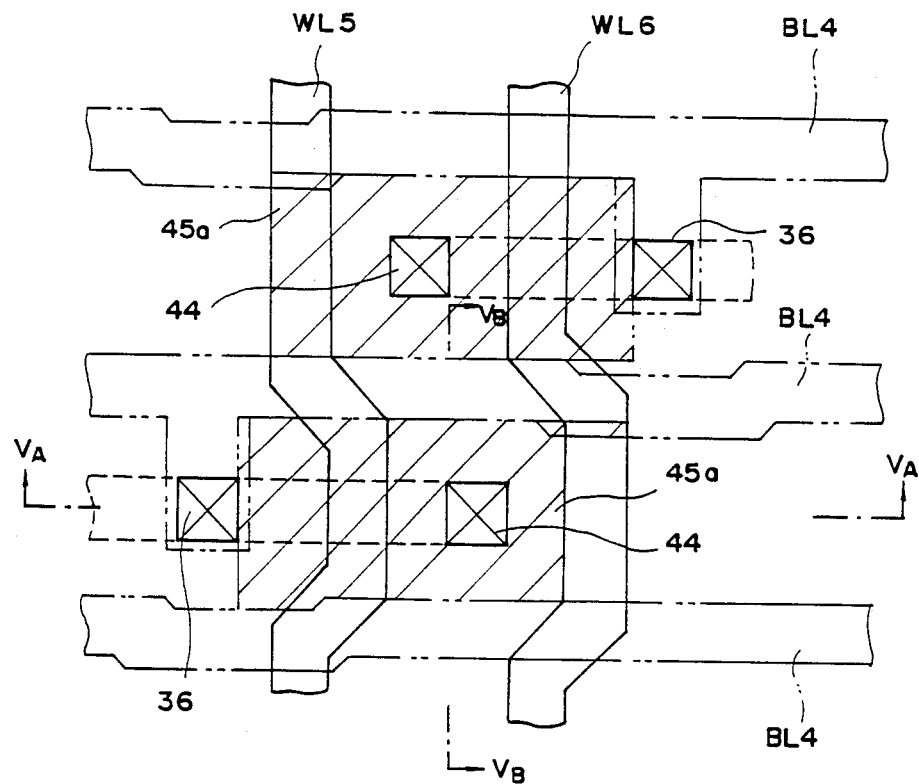

A description is given of the fourth embodiment of the present invention with reference to FIGS. 5A through 5C. FIGS. 5A and 5B are cross sectional views taken along the lines $V_A$—$V_A$ and $V_B$—$V_B$ of FIG. 5C, respectively. Referring to FIGS. 5A through 5C, a field insulation film 32 is formed on a main surface of a p-type silicon substrate 31. A gate insulation film 33 is formed on the surface of the silicon substrate 31. Gate electrodes, or word lines WL5 and WL6 are formed on the gate insulation film 33 and the field insulation film 32, respectively. Then, source and drain regions 34S and 34D are formed in the silicon substrate 31. The source and drain regions 34S and 34D are n+-type impurity diffusion regions. The word lines WL5 and WL6 are covered with an interlayer insulation film 35 of silicon dioxide. Bit line contact holes 36 are formed in the interlayer insulation film 35 and the gate insulation film 33. Bit lines BL4 are formed on the interlayer insulation film 35, and are in contact with the respective source regions 34S through bit line contact holes 36. A silicon nitride film 38 is formed so as to cover the bit lines BL4. A transfer gate transistor T4 of the fourth embodiment is composed of the source and drain regions 34S and 34D, the word electrode WL5 and the bit line BL4.

Storage electrode contact holes 44 are formed so as to penetrate the silicon nitride film 38, the interlayer insulation film 35 and the gate insulation film 33. A memory cell capacitor C4 includes a storage electrode 45, a dielectric film 46 and an opposed electrode 47. The storage electrode 45 of polysilicon has a vertical portion 45a and three flange or wing portions 45b which are connected to the vertical portion 45a. The vertical portion 45a is in contact with the drain region 34D. The uppermost wing portion 45b is formed integrally with the vertical portion 45a. The wing portions 45b are separated from each other in the vertical direction. In other words, a gap is formed between the adjacent wing portions 45b. The above-mentioned structure enables an increase of the capacitance of the storage capacitor C4. The wing portions 45b extend above the gate electrodes WL5 and WL6. A surface of the storage electrode 45 is covered with the dielectric film 46 of silicon dioxide. The opposed electrode 47 of polysilicon are formed so as to cover the dielectric film 46. It is noted that the gap between the adjacent wing portions 45b is filled with polysilicon of the opposed electrode 47. The storage electrode 45 and the opposed electrode 47 are doped with $n^+$-type impurity such as arsenic (As) and phosphorus (P), respectively.

As can be seen from FIGS. 5A through 5C, the surface area of the storage electrode 45 can be greatly increased. As a result, the memory cell capacitor including the storage electrode 45 has a further increased capacitance value.

A description is given of a method for producing the first embodiment of the present invention with reference to FIGS. 6A through 6F, and FIGS. 7A through 7F. FIGS. 6A through 6F show cross sectional views along the line $II_A$—$II_A$ shown in FIG. 2C observed at different manufacturing steps, and FIGS. 7A through 7F show cross sectional views along the line $II_B$—$II_B$ shown in FIG. 2C observed at different manufacturing steps.

Figure 6A:
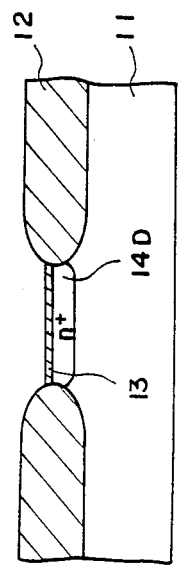
Figure 7A:
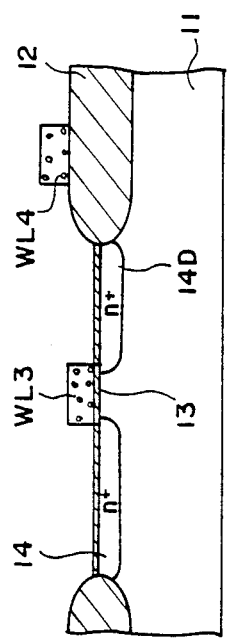

Referring to FIGS. 6A and 7A, the field insulation film 12 is formed by a selective thermal oxidation process such as the LOCOS process in which an oxidation-resistant mask film is used. After removing the oxidation-resistant mask film, the gate insulation film 13 is formed to a thickness of about 200 [Å] by a thermal oxidation process. Then, a polysilicon film is deposited to a thickness of approximately 2000 [Å] by chemical vapor deposition (CVD). Thereafter, the polysilicon film is patterned so as to form the gate electrodes WL3 and WL4. The patterning process is carried out by forming a resist mask film by the conventional photolithography technology, and then etching the polysilicon film by reactive ion etching (RIE) in which an etching gas of $CCl_4/O_2$ is used. Thereafter, impurity ions such as arsenic ions ($As^+$) are implanted into the silicon substrate 11 by self-alignment in which the gate electrodes WL3 and WL4 are used as a mask film. Thereby, the source and drain regions 14S and 14D are formed in the silicon substrate 11.

Figure 6B:
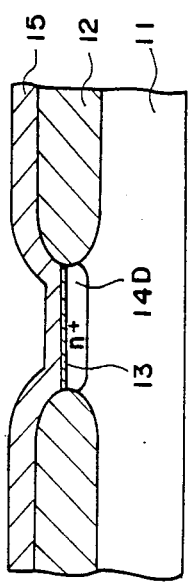
Figure 7B:
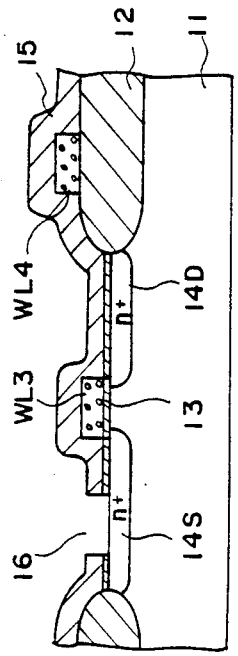

Referring to FIGS. 6B and 7B, the interlayer insulation film 15 of silicon dioxide is deposited to a thickness of approximately 1000 [Å] so as to cover the gate electrodes WL3 and WL4. Then the interlayer insulation film 15 is etched by an anisotropic etching process such as RIE so as to form the opening (bit line contact hole) 16. In the RIE process, an etching gas of $CHF_3 + H_2$ is used.

Figure 6C:
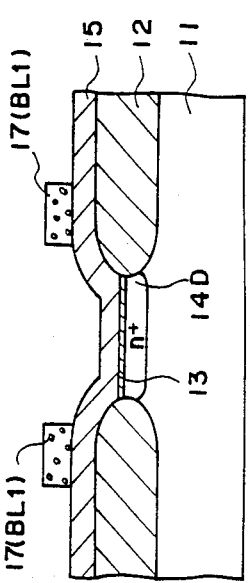
Figure 7C:
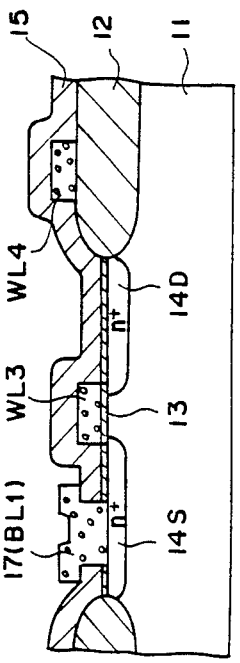

Referring to FIGS. 6C and 7C, an impurity-doped polysilicon film having a thickness of approximately 1000 [Å] is deposited on the entire surface of the silicon substrate 11 by low-pressure chemical vapor deposition. Then deposited polysilicon film is patterned by anisotropic etching such as RIE so as to form the bit lines (BL1) 17. A polycide film can be substituted with the polysilicon film. In this case, a polysilicon film is deposited, and then a tungsten silicide film is deposited on the polysilicon film. Thereafter, the polysilicon film and the tungsten silicide film are patterned by the conventional photolithography technology. The tungsten silicide film can be substituted with a refractory metal film of molybdenum silicide, tantalum silicide, or titanium silicide.

Referring to FIGS. 6D and 7D, the insulation film 18 of silicon dioxide or silicon nitride is deposited by chemical vapor deposition so as to cover the bit lines 17. After providing a mask film (not shown) on the insulation film 18, the insulation film 18, the interlayer insulation film 15 and the gate insulation film 13 are etched so as to form an opening 19. The opening 19 functions as the storage electrode contact hole 20A.

Referring to FIGS. 6E and 7E, a polysilicon film 20 is deposited by chemical vapor deposition on the entire surface of the silicon substrate 11, and is then patterned by anisotropic etching such as RIE so as to form the storage electrodes 20a. The polysilicon film 20 is approximately 4000 [Å] thick. An etching gas of $CCl_4/O_2$ is used in the anisotropic etching process.

Referring to FIGS. 6F and 7F, the dielectric film 21 having a thickness of approximately 100 [Å] is formed by thermal oxidation with respect to the storage electrodes 20a. Then, as shown in FIGS. 2A and 2B, the opposed electrodes 22 are deposited so as to cover the dielectric films 21.

The manufacturing process for the second embodiment is the same as that for the first embodiment except for the size of the source region 14S and the mask film used for forming the opening 16a in the gate insulation film 13 and the interlayer insulation film 15. Therefore, a description of the manufacturing process for the second embodiment is omitted.

A description is given of a method for producing the third embodiment of the present invention with reference to FIGS. 8A through 8H, and FIGS. 9A through 9H. The steps of FIGS. 8A and 9A, and FIGS. 8B and 9B are the same as those of FIGS. 6A and 7A, and FIGS. 6B and 7B. Therefore, a description of the steps of FIGS. 8A, 9A, 8B and 9B are omitted.

Figure 9A:
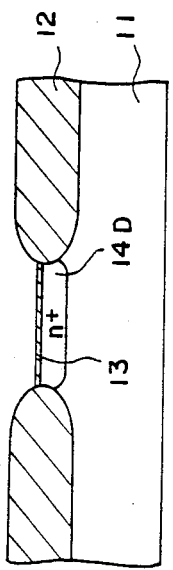
Figure 9B:
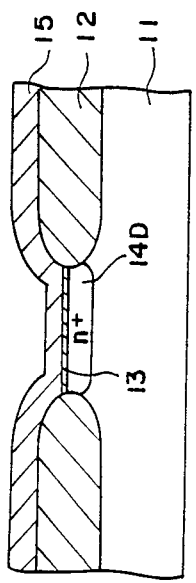
Figure 9C:
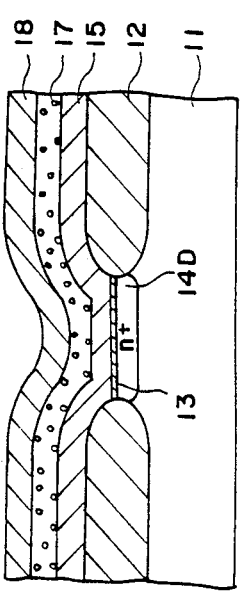
Figure 8A:
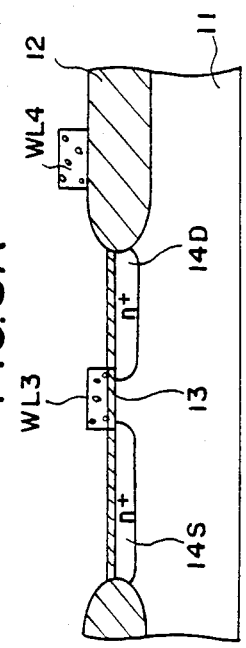
Figure 8B:
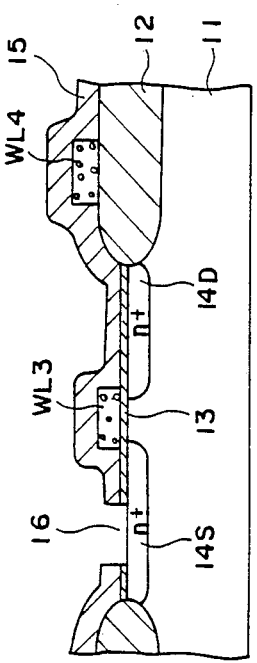
Figure 8C:
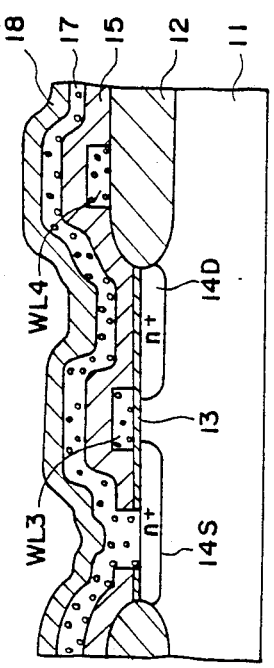

Referring to FIGS. 8C and 9C, a polycide film 17 and a silicon dioxide film 18 are grown by low-pressure chemical vapor deposition. The polycide film 17 can be substituted with a polysilicon film containing $n^+$-type impurity ions.

Referring to FIGS. 8D and 9D, after providing a resist mask film (not shown), the polycide film 17 is patterned by anisotropic etching such as RIE so as to form the bit lines such as BL32 and BL33. At this step, it is preferable that portions of the silicon dioxide film 18 on the patterned polycide films 17 are left. The presence of the silicon dioxide film 18 on the patterned polycide film 17 is necessary to form the storage electrode contact holes 24 by self-alignment, as described later.

Referring to FIGS. 8E and 9E, the silicon dioxide film 23 having a thickness of approximately 1000 [Å] is deposited on the entire surface of the silicon substrate 11 by chemical vapor deposition.

Figure 8F:
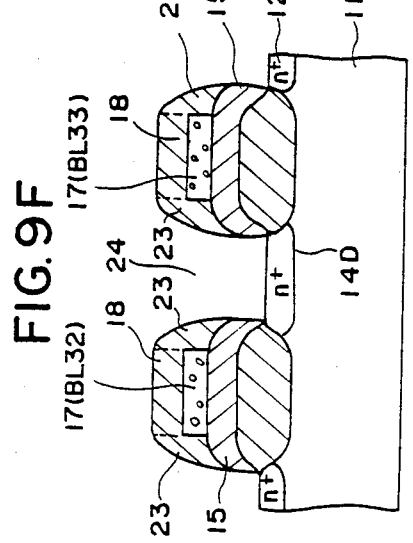
Figure 9F:
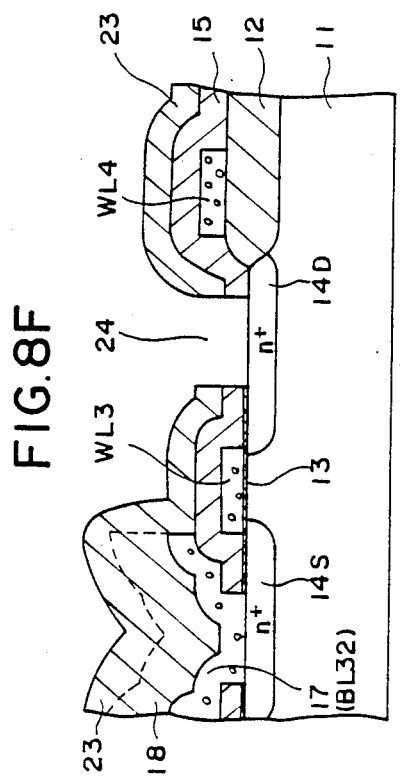

Referring to FIGS. 8F and 9F, the opening or storage electrode contact hole 24 is formed by anisotropic etching such as RIE so as to penetrate the silicon dioxide film 23, the interlayer insulation film 15 and the gate insulation film 13. The opening 24 can be formed by self-alignment in which the bit lines BL32 and BL33 are used as a mask film. It is noted that as shown in FIG. 9F, the upper surface of each polycide film 17 is covered with the silicon dioxide film 18, and side walls of each polycide film 17 and side walls of each the silicon dioxide film 18 are covered with the silicon dioxide film 23. The presence of the silicon dioxide film 18 on the upper surface of the polycide film 17 can prevent shorting between the polycide film 17 and a polysilicon film 25 deposited in the subsequent manufacturing step. In a case where the silicon dioxide film 18 is completely removed at the step of FIGS. 8D and 9D, the upper and/or side surfaces of the polycide film 17 may be partially exposed after the step of FIGS. 8F and 9F. For the sake of simplicity, a group of the insulation films covering the polycide film 17 is indicated by a reference numeral 23 in other figures.

It is noted that an alignment margin or tolerance is not needed at the time of forming the opening 24 by the self-alignment process. On the other hand, in the aforementioned method for producing the first embodiment, some alignment margin is necessary to prevent the bit lines BL1 from being exposed after the step of FIGS. 6D and 7D.

Figure 8G:
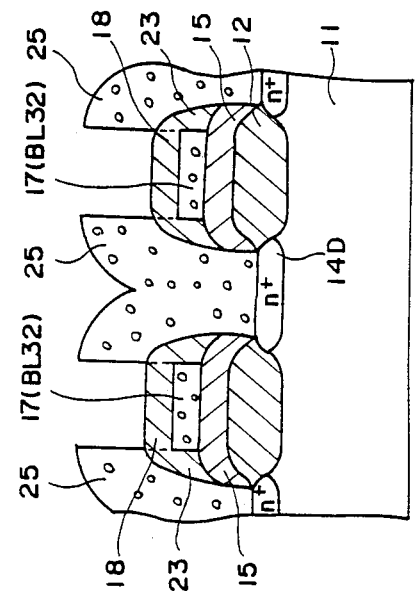
Figure 9G:
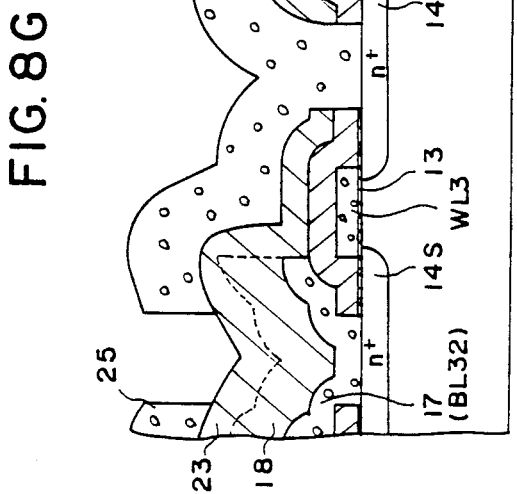

Referring to FIGS. 8G and 9G, the polysilicon film 25 is deposited on the entire surface of the silicon substrate 11 by low-pressure chemical vapor deposition. Thereafter, a resist mask film (not shown) is deposited, and then the polysilicon film 25 is patterned by anisotropic etching such as RIE. Each patterned polysilicon film 25 provides the storage electrodes 25a.

Figure 9H:
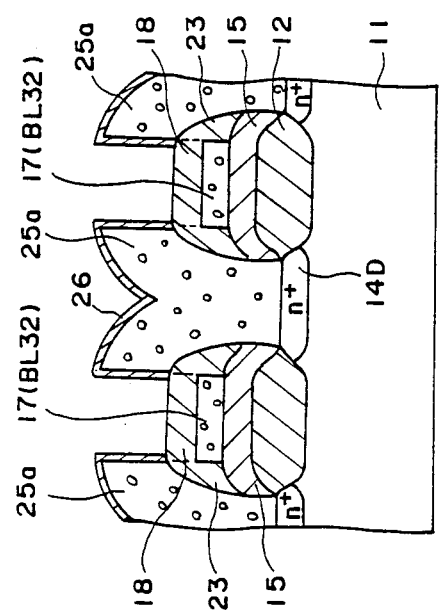
Figure 8H:
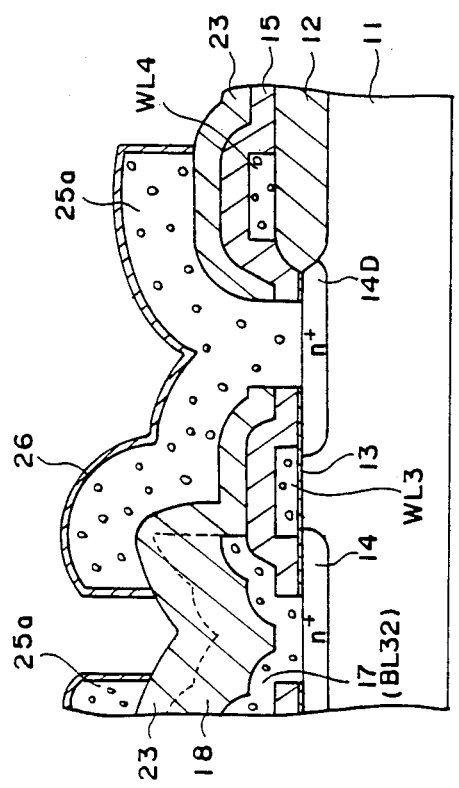

Then, as shown in FIGS. 8H and 9H, the dielectric film 26 of silicon dioxide is formed so as to cover the surface of each storage electrode 25. Finally, the polysilicon film 27 is deposited so as to cover the dielectric film 26 as shown in FIGS. 4A and 4B.

A description is given of a method for producing the fourth embodiment of the present invention with reference to FIGS. 10A through 10J, and FIGS. 11A through 11J.

Figure 11A:
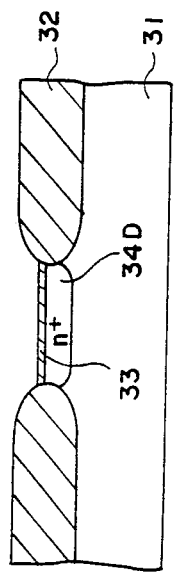
FIGS. 11A through 11J are cross sectional views taken along the line $III_B$—$III_B$ shown in FIG. 5C, which are observed in different manufacturing steps for the fourth embodiment.
Figure 10A:
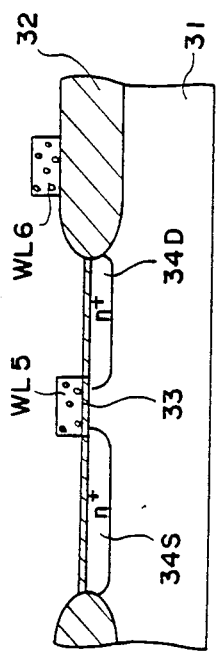
FIGS. 10A through 10J are cross sectional views taken along the line $III_A$—$III_A$ shown in FIG. 5C, which are observed in different manufacturing steps for the fourth embodiment.

Referring to FIGS. 10A and 11A, the field insulation film 32, the source and drain regions 34S and 34D, the gate insulation film 33, and the gate electrodes WL5 and WL6 are formed, as in the case of the manufacturing process for the first embodiment.

Figure 11B:
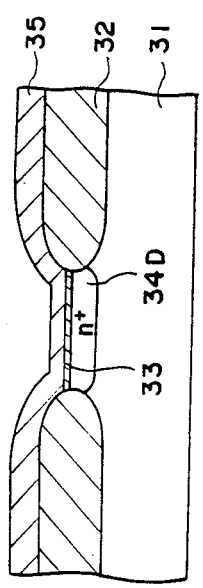
Figure 10B:
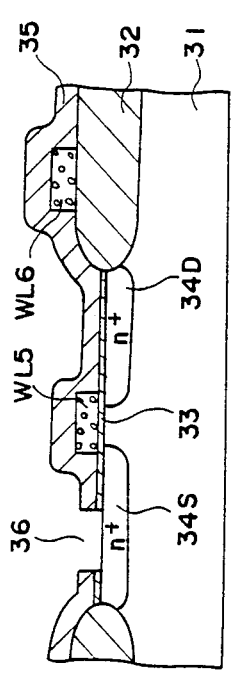

Referring to FIGS. 10B and 11B, the interlayer insulation film 35 of silicon dioxide is deposited on the entire surface of the silicon substrate 31. After depositing a resist mask film (now shown), the opening 36 is formed in the interlayer insulation film 35 and the gate insulation film 33 by anisotropic etching such as RIE in which an etching gas of $CHF_3 + H_2$ is used. The opening 36 function as the bit line contact hole.

Figure 11C:
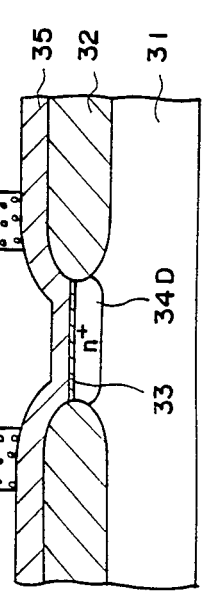
Figure 10C:
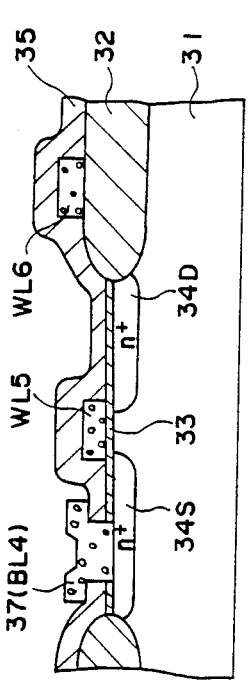

Referring to FIGS. 10C and 11C, an impurity-doped polysilicon film is deposited to a thickness of approximately 1000 [Å] by low-pressure chemical vapor deposition, and is then patterned by anisotropic etching such as RIE. The patterned polysilicon film 37 provides the bit lines such as BL4. The polysilicon film can be substituted with a polycide film.

Figure 10D:
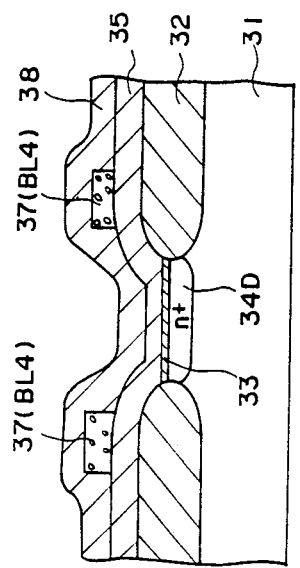
Figure 11D:
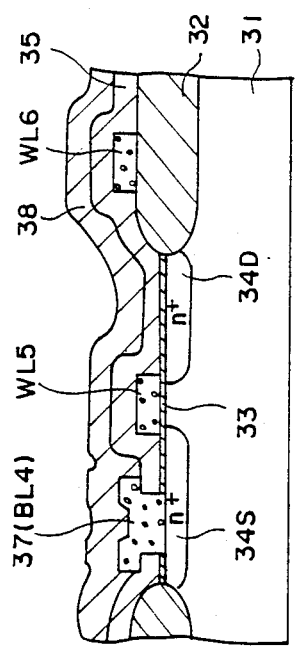

Referring to FIGS. 10D and 11D, the insulation film 38 of silicon nitride is formed on the entire surface of the silicon substrate 31. As shown, the patterned polysilicon film 3 is covered with the insulation film 38.

Figure 10E:
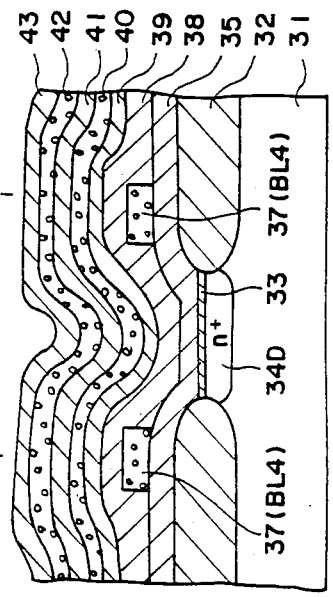
Figure 11E:
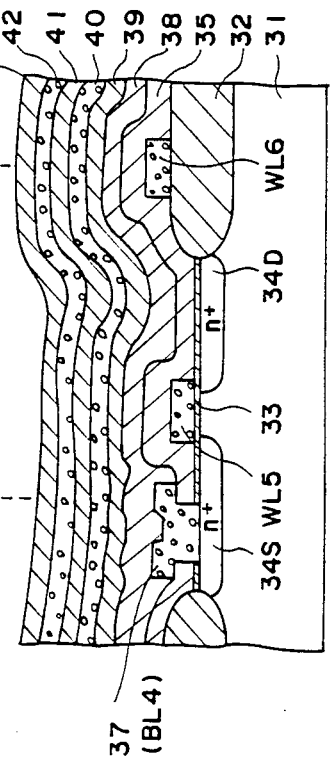

Referring to FIGS. 10E and 11E, a silicon dioxide film 39 having a thickness of approximately 1000 [Å], and a polysilicon film 40 which contains impurity ions and has a thickness of approximately 1000 [Å], are sequentially deposited. Further, a silicon dioxide film 41 having the same thickness and a polysilicon 42 having the same thickness are sequentially deposited. In this manner, N+1 number of times of deposition of the silicon dioxide film, and N number of times of deposition of the polysilicon film are carried out as necessary.

Figure 10F:
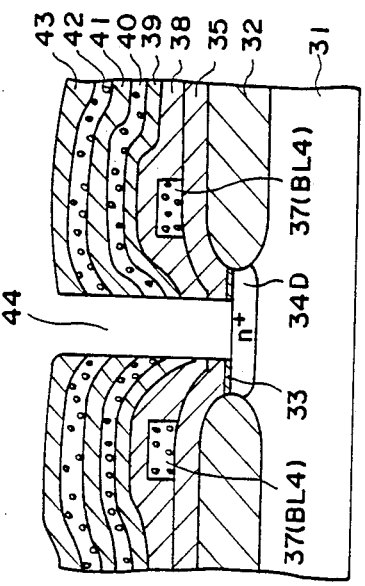
Figure 11F:
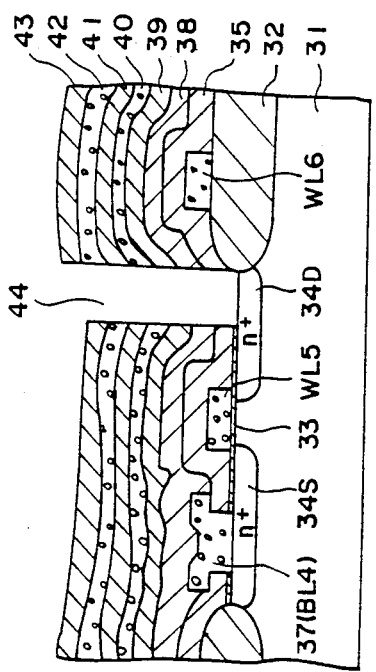

Referring to FIGS. 10F and 11F, N+1 silicon dioxide films, N polysilicon films, the silicon nitride film 38, the interlayer insulation film 35 and the gate insulation film 33 are etched by anisotropic etching such as RIE so as to form the opening 44. In this etching process, an etching gas of $CHF_3 + H_2$ is used with respect to the silicon dioxide and silicon nitride films, and an etching gas of $CCl_4/O_2$ is used with respect to the polysilicon films.

Figure 10G:
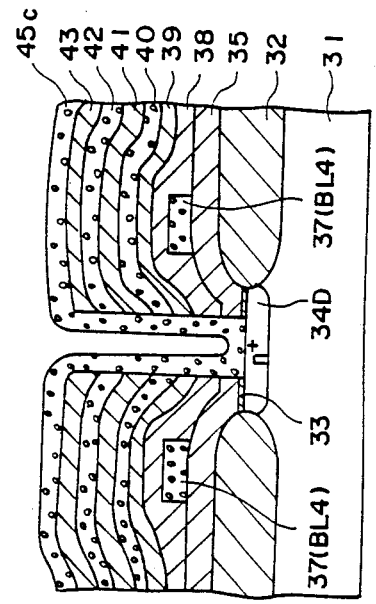
Figure 11G:
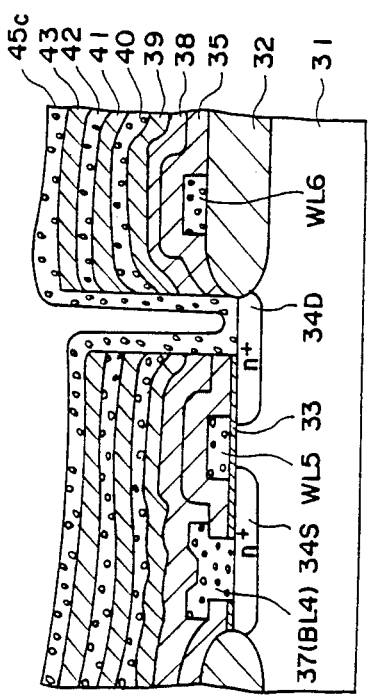

Referring to FIGS. 10G and 11G, a polysilicon film 45c is deposited on the entire surface of the silicon substrate 31 by low-pressure chemical vapor deposition. Thereby the top and side surfaces of a stacked layer composed of the silicon dioxide and polysilicon films are covered with the polysilicon film 45c.

Figure 11H:
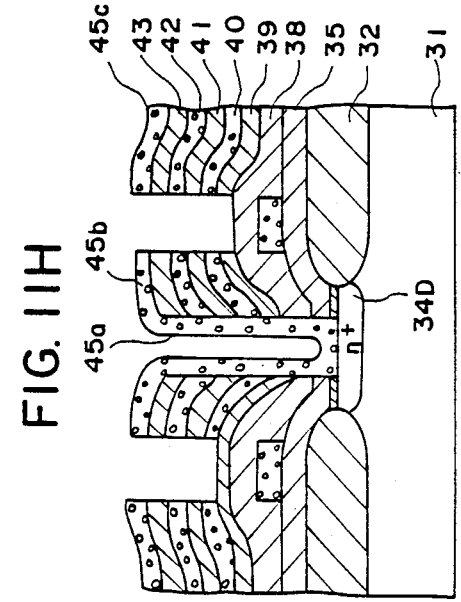
Figure 10H:
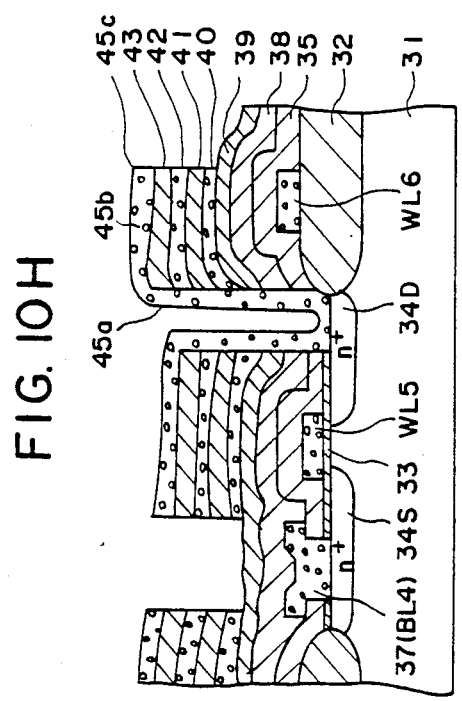

Referring to FIGS. 10H and 11H, the polysilicon films 45c, 42 and 40, and the silicon dioxide films 43 and 41 are patterned by anisotropic etching such as RIE. The patterned polysilicon film 45c has the vertical portion 45a and the wing portion 45b. The patterned polysilicon films 42 and 40 correspond to the wing portions 45b shown in FIGS. 5A and 5B.

Figure 11I:
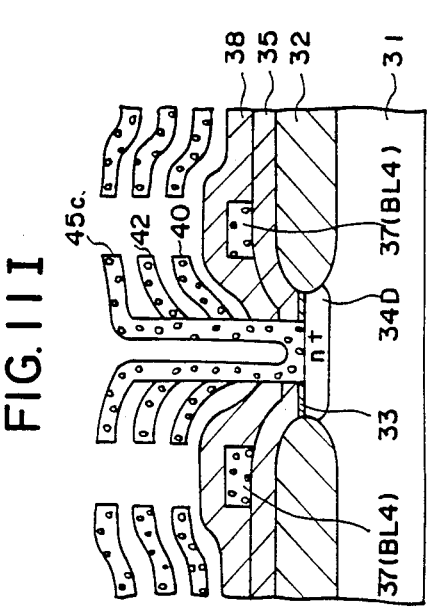
Figure 10I:
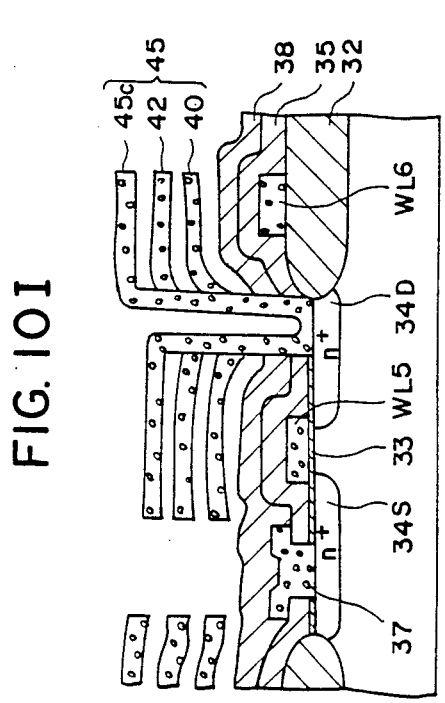

Referring to FIGS. 10I and 11I, the patterned silicon dioxide films 43, 41 and 39 are removed by an isotropic etching process in which an etching liquid of HF is used. It is noted that the polysilicon film 37 of the bit line BL4, and the silicon nitride film 38 covering the gate electrodes WL5 and WL6 are not etched with an HF etching liquid. As shown, the storage electrode 45 has a tree-shaped cross section.

Figure 11J:
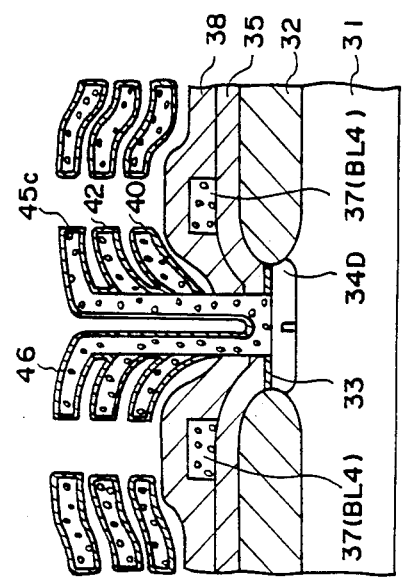
Figure 10J:
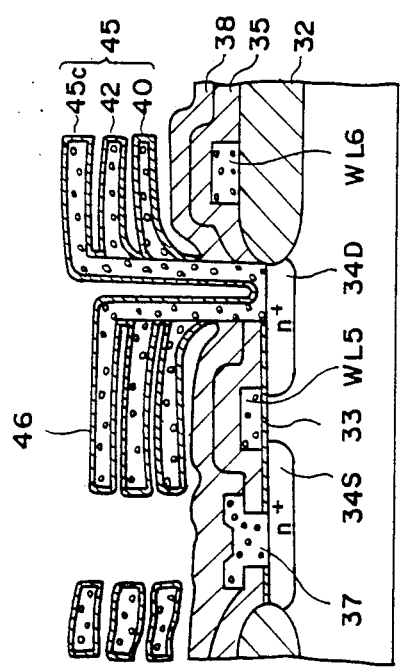

Referring to FIGS. 10J and 11J, the dielectric film of silicon dioxide 46 is formed on the surface of the storage electrode 45 by thermal oxidation. Then, the opposed electrode 47 of polysilicon is formed so as to cover the dielectric film 46.

Figure 13A:
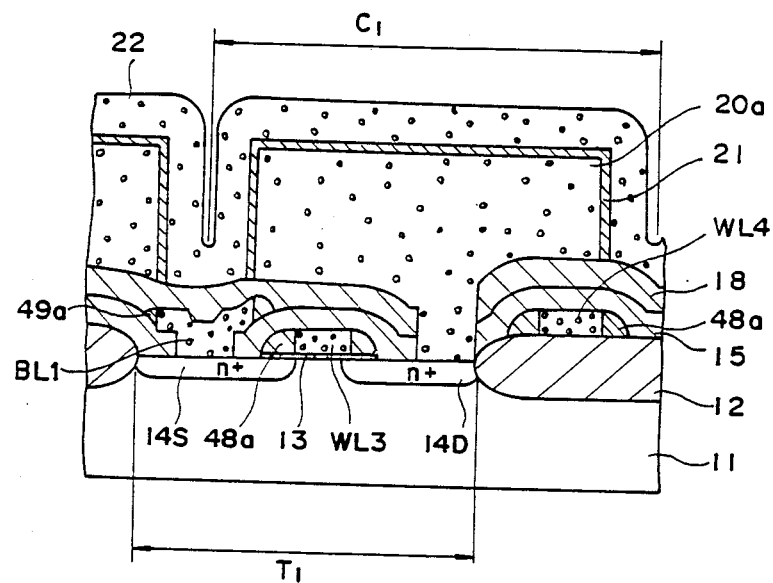
FIGS. 13A through 13C are views showing a modification of the first embodiment.
Figure 13B:
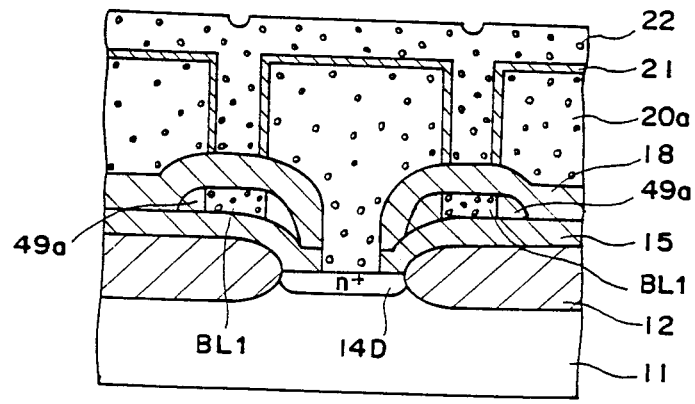
Figure 13C:
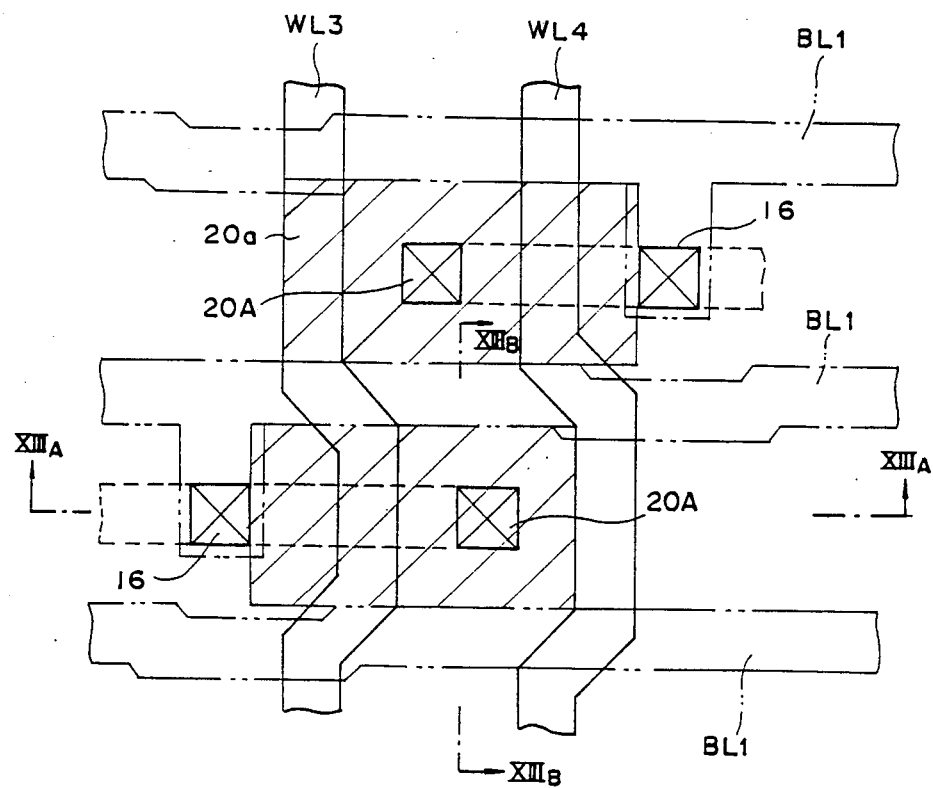

A description is given of a modification of the first embodiment with reference to FIGS. 13A through 13C. In FIGS. 13A through 13C, those parts which are the same as those in FIGS. 2A through 2C, are indicated by the same reference numerals.

Figure 12A:
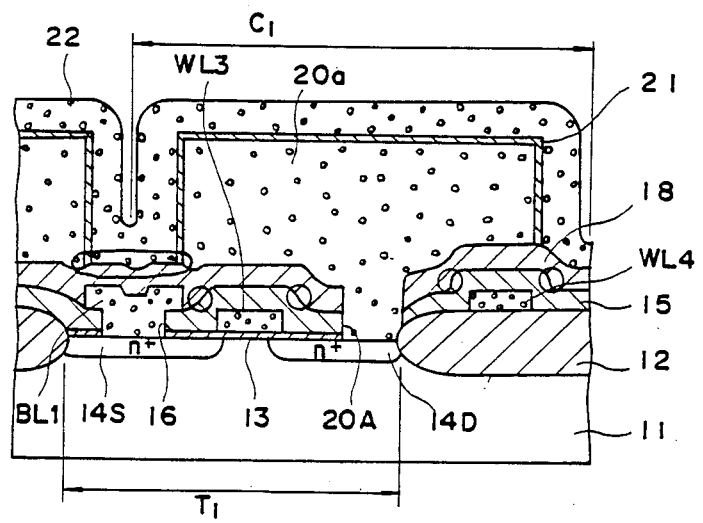
FIGS. 12A and 12B are cross sectional views for describing some problems which may be encountered in the first embodiment.
Figure 12B:
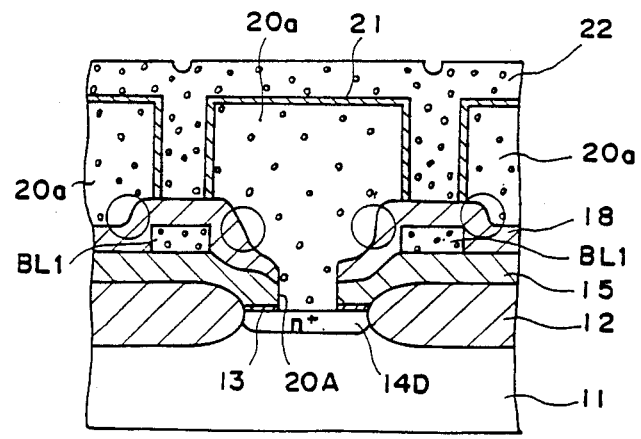

The modification of the first embodiment has an essential feature in which side wall films are provided so as to surround side surfaces of the gate electrodes WL3 and WL4 and the bit lines BL1. In FIGS. 12A and 12B which show the cross section of the aforementioned first embodiment, film portions surrounded by circles are not flat, and have some differences in vertical layer level. In other words, the film portions surrounded by the circles are convex and recess portions. The presence of some convex and recess portions makes it difficult to suitably form a film thereon. Additionally, it is inevitable that the film formed on the convex and recess portions becomes thin. Additionally, a film portion under an overhand portion may remain without being etched. As a result, insulation properties of the film are degraded. The modification of the first embodiment can overcome the above disadvantages.

Referring to FIGS. 13A through 13C, side wall films 48a of silicon dioxide or silicon nitride are provided so as to surround vertical side walls of the gate electrodes WL3 and WL4. The cross section of each side wall film 48a has a slope which connects the upper surface of the word line WL3, WL4 and the upper surface of the field insulation film 12 or the gate insulation film 13. The side wall films 48a contribute to smoothing the upper surface of the insulation film 15, providing easy etching with respect to films formed on the insulation film 15, and improving the insulation properties of the insulation film 15.

Side wall films 49a of silicon dioxide or silicon nitride are provided so as to surround vertical side walls of the bit lines BL1. The cross section of each side wall film 49a has a slope which connects the upper surface of the bit line BL1 and the upper surface of the interlayer insulation film 15. The side wall films 49a contribute to improving the insulation properties of the interlayer insulation film 18, providing easy etching with respect to films on the insulation film 18, and smoothing the upper surface of the interlayer insulation film 18.

A description is given of a method for producing the modified device of FIG. 13A through 13C with reference to FIGS. 14A through 14K, and FIGS. 15A through 14K.

The step of FIGS. 14A and 15A is the same as that shown in FIGS. 6A and 7A. Therefore, a description with respect to FIGS. 14A and 15A is omitted.

Referring to FIGS. 14B and 15B, an insulation film 48 of silicon dioxide is formed on the entire surface of the silicon substrate 11 by chemical vapor deposition. Thereafter, the insulation film 48 is dry-etched by anisotropic etching such as RIE. Thereby, as shown in FIGS. 14C and 15C, film portions around the side walls of the gate electrodes WL3 and WL4 are remained without being removed. Such film portions are the side wall films 48a. In the etching process of the silicon dioxide film 48, an etching gas of $CHF_3 + H_2$ is used.

Figure 15D:
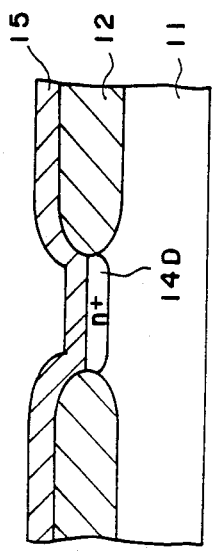
Figure 14D:
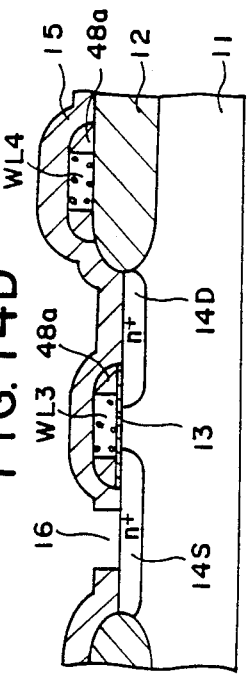

Referring to FIGS. 14D and 15D, the interlayer insulation film 15 of silicon dioxide having a thickness of about 1000 [Å] is deposited on the entire surface of the silicon substrate 11. Then a resist mask film (not shown) is placed on the silicon substrate 11, and the insulation film 15 is etched by anisotropic etching such as RIE so as to form the opening 16 of the bit line contact hole.

Figure 15E:
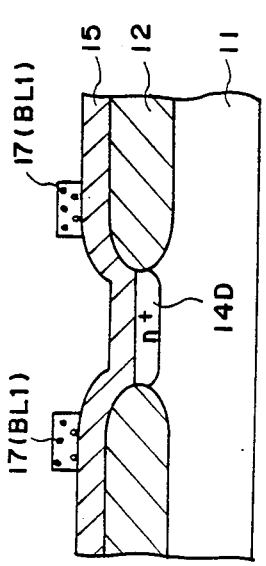
Figure 14E:
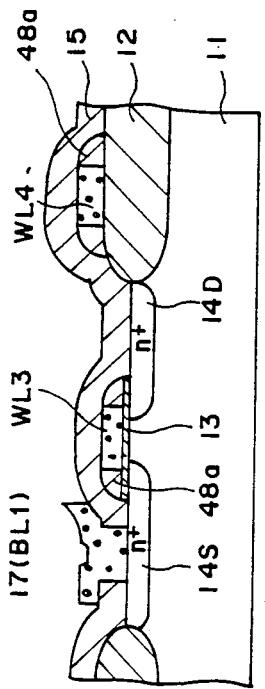

Referring to FIGS. 14E and 15E, the polysilicon film containing $n^+$-type impurity ions such as arsenic ions ($As^+$) is deposited to a thickness of approximately 1000 [Å] by low-pressure chemical vapor deposition. Subsequently, a tungsten silicide film is deposited to a thickness of approximately 1000 [Å] by chemical vapor deposition. Then the polysilicon and tungsten silicide films are subjected to the patterning process based on RIE. Thereby, the patterned polysilicon and tungsten silicide films 17 of the bit lines BL1 are formed.

Figure 15F:
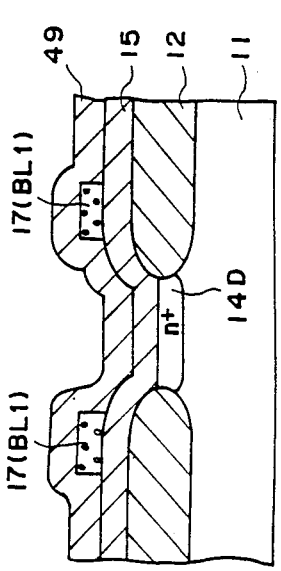
Figure 14F:
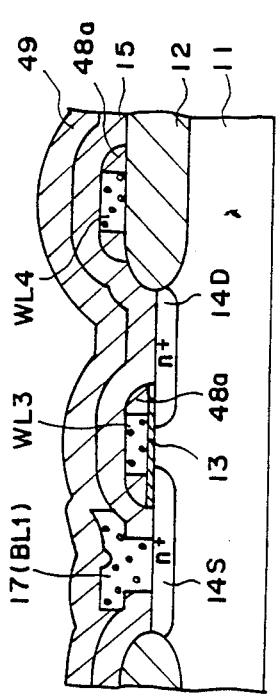
Figure 14G:
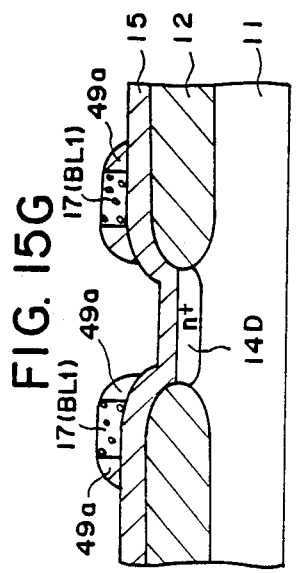
Figure 15G:
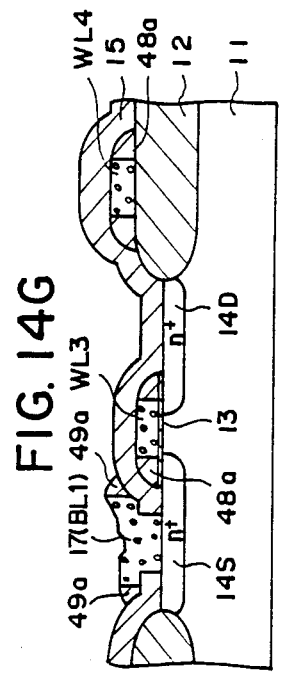
Figure 15G:
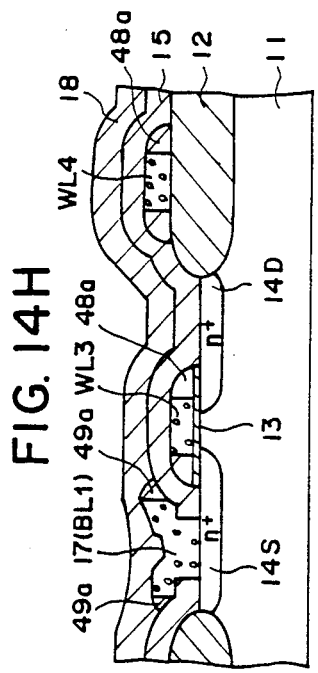

Referring to FIGS. 14F and 15F, a silicon dioxide film 49 is deposited to a thickness of about 2000 [Å] by chemical vapor deposition. Thereafter, the silicon dioxide film 49 is subjected to anisotropic etching such as RIE in which $CHF_3 + H_2$ is used. Thereby, as shown in FIGS. 14G and 15G, film portions 49a around the side walls of the bit line BL1 are left without being removed. Such film portions 49a are side wall films around the bit lines BL1.

Figure 14H:
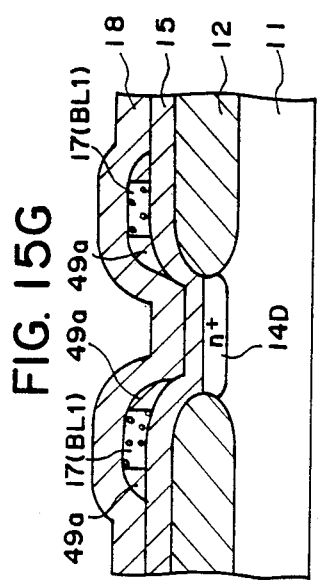

Referring to FIGS. 14H and 15H, the insulation film 18 of silicon dioxide or silicon nitride is deposited on the entire surface of the silicon substrate 11 by chemical vapor deposition. The insulation film 18 is approximately 1000 [Å].

Figure 14I:
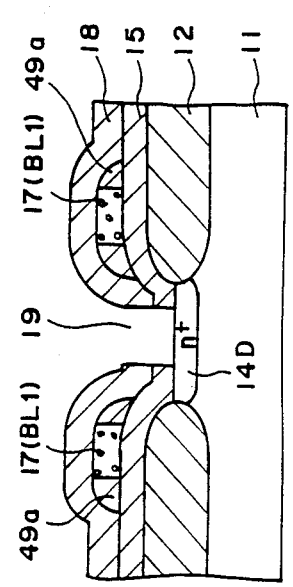
Figure 15I:
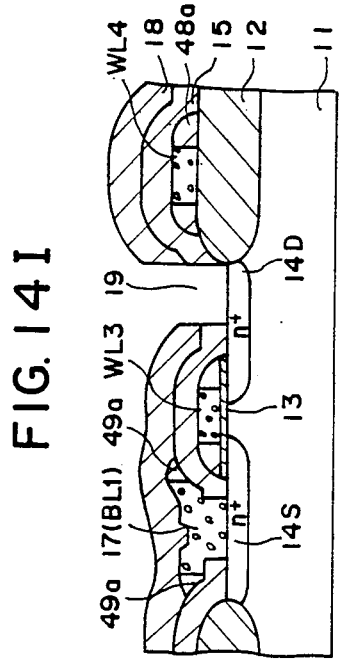

Referring to FIGS. 14I and 15I, by using a resist mask film (not shown), the insulation film 18 and the interlayer insulation film 15 are selectively etched so as to form the opening 19 through which a surface of the drain region 14D is exposed. The opening 19 functions as the storage electrode contact hole.

Referring to FIGS. 14J and 15J, the polysilicon film 20 containing $n^+$-type impurity ions is deposited, and is then patterned by anisotropic etching such as RIE in which a resist mask film (not shown) is used. The patterned polysilicon film 20 provides storage electrodes 20a.

Figure 14K:
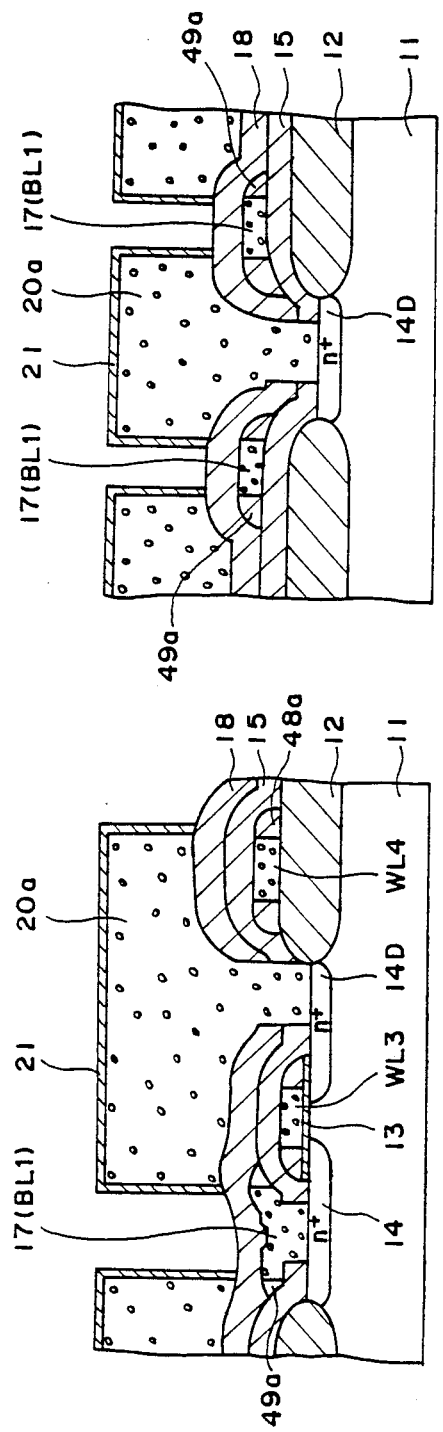
Figure 15K:
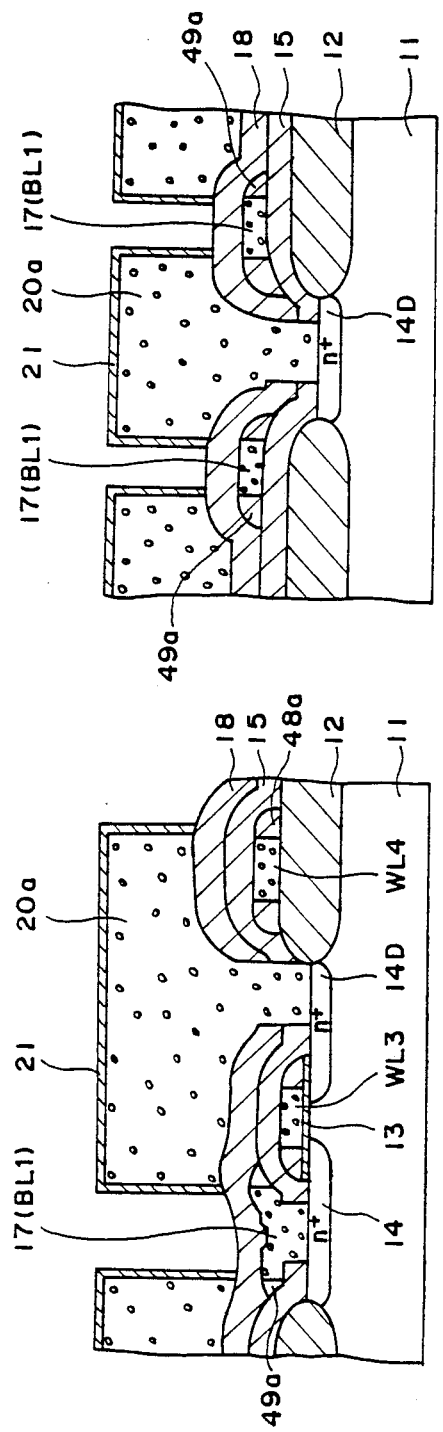

Referring to FIGS. 14K and 15K, the dielectric film 21 is formed by thermal oxidation so as to surround the surface of each storage electrode 20a. Finally, the opposed electrode 22 is formed so as to cover the dielectric films 21.

According to the modification of the first embodiment, the electrical insulation between the gate electrodes WL3 and WL4 and the storage electrode 20a and between the bit lines BL1 and the storage electrode 20a, can be greatly improved. Additionally, upper surfaces of the insulation films such as the interlayer insulation film 15 and the insulation film 18 are made flat. As a result, easy etching for obtaining bit lines BL1 and storage electrodes 20a is obtainable.

The aforementioned side wall films are applicable to the second, third and fourth embodiments of the present invention.

The present invention is not limited to the aforementioned embodiments, and variations and modifications may be made without departing from the scope of the present invention.

What is claimed is:

1. A dynamic random access memory device comprising:
   a semiconductor substrate having a source region and a drain region;
   a first insulation film formed on a surface of the semiconductor substrate;
   a gate electrode formed on the first insulation film;
   a second insulation film formed so as to cover the gate electrode;
   a bit line formed on the second insulation film, the bit line being in contact with the source region through a first opening formed in at least the second insulation film;
   a third insulation film formed so as to cover the bit line;
   a storage electrode formed on the third insulation film and being in contact with the drain region through a second opening formed in at least the second and third insulation films;
   a dielectric film formed so as to surround the storage electrode; and
   an opposed electrode formed so as to cover the dielectric film.

2. A dynamic random access memory device as claimed in claim 1, wherein the first opening and the second opening are aligned in the direction of extension of the bit line.

3. A dynamic random access memory device as claimed in claim 1, wherein a distance between the bit line and the first opening is smaller than a distance between the bit line and the second opening.

4. A dynamic random access memory device as claimed in claim 1, wherein the second opening is a contact hole formed by self-alignment in which the bit line itself is used as a mask film.

5. A dynamic random access memory device as claimed in claim 1, wherein the bit line comprises a polycide film composed of a polysilicon film, and a refractory metal film formed on said polysilicon film.

6. A dynamic random access memory device as claimed in claim 1, further comprising an insulation side wall film formed so as to surround a side wall of the bit line.

7. A dynamic random access memory device as claimed in claim 1, further comprising an insulation side wall film formed so as to surround a side wall of the gate electrode.

8. A dynamic random access memory device as claimed in claim 1, wherein the storage electrode comprises a vertical portion which is in contact with the drain region, and wing portions which are separated from each other with a gap and are connected to the vertical portion.

9. A dynamic random access memory device as claimed in claim 1, wherein the wing portions of the storage electrode extend above the gate electrode.

10. A dynamic random access memory device as claimed in claim 1, wherein said first insulation film is a gate insulation film, wherein said first opening is formed in said first and second insulation films, and wherein said second opening is formed in said first, second and third insulation films.

11. A dynamic random access memory device, comprising:
   a semiconductor substrate having a source region and a drain region;
   a gate insulation film formed on a surface of said semiconductor substrate;
   a gate electrode formed on said gate insulation film;
   a first insulation film formed covering said gate electrode;
   a first opening formed in said first insulation film and formed over said source region;
   a bit line formed on said first insulation film, said bit line being in contact with said source region through said first opening formed in said first insulation film;
   a second insulation film formed covering said bit line;
   a second opening formed in said first and second insulation films and over said drain region;
   a storage electrode extending above said second insulation film and being in contact with said drain region through said second opening formed in said first and second insulation films;
   a dielectric film formed surrounding said storage electrode; and
   an opposed electrode formed covering said dielectric film.

12. A dynamic random access memory device as claimed in claim 11, wherein said first opening and said second opening are aligned in a direction in which said bit line extends.

13. A dynamic random access memory device as claimed in claim 11, wherein a distance between said bit line and said first opening is smaller than a distance between said bit line and said second opening.

14. A dynamic random access memory device as claimed in claim 11, wherein said second opening is a contact hole formed by self alignment in which said bit line is used as a mask film.

15. A dynamic random access memory device as claimed in claim 11, wherein said bit line comprises polycide film composed of a polysilicon film, and a refractory metal film formed on said polysilicon film.

16. A dynamic random access memory device as claimed in claim 11, further comprising an insulation side wall film formed surrounding a side wall of said bit line.

17. A dynamic random access memory device as claimed in claim 11, further comprising an insulation side wall film formed surrounding a side wall of said gate electrode.

18. A dynamic random access memory device as claimed in claim 11, wherein said first opening is formed in said gate insulation film and said first insulation film, and said second opening is formed in said gate insulation film and said first and second insulation films.

* * * * *